US00RE45497E

(19) United States
(12) Reissued Patent
Dutta et al.

(10) Patent Number: US RE45,497 E
(45) Date of Reissued Patent: Apr. 28, 2015

(54) PROGRAMMING MEMORY WITH REDUCED PASS VOLTAGE DISTURB AND FLOATING GATE-TO-CONTROL GATE LEAKAGE

(71) Applicant: SanDisk Technologies Inc., Plano, TX (US)

(72) Inventors: Deepanshu Dutta, Santa Clara, CA (US); Henry Chin, Santa Clara, CA (US)

(73) Assignee: SanDisk Technologies Inc., Plano, TX (US)

(21) Appl. No.: 14/231,112

(22) Filed: Mar. 31, 2014

Related U.S. Patent Documents

Reissue of:
(64) Patent No.: 8,134,871
Issued: Mar. 13, 2012
Appl. No.: 12/536,127
Filed: Aug. 5, 2009

(51) Int. Cl.
*G11C 16/04* (2006.01)
*G11C 16/34* (2006.01)
*G11C 11/56* (2006.01)

(52) U.S. Cl.
CPC ..... *G11C 16/0483* (2013.01); *G11C 16/3427* (2013.01); *G11C 16/3418* (2013.01); *G11C 11/5628* (2013.01)

(58) Field of Classification Search
CPC ..... G11C 11/5628; G11C 16/0483; G11C 16/3427; G11C 16/3418
USPC ..... 365/185.06, 185.03, 185.22, 186.06
See application file for complete search history.

(56) References Cited

U.S. PATENT DOCUMENTS 6,552,929 B1 4/2003 Parker
6,717,846 B1 * 4/2004 Lee et al. ..... 365/185.02
6,807,095 B2 10/2004 Chen et al.

(Continued)

FOREIGN PATENT DOCUMENTS

CN 1228600 A 9/1999
JP 2008-090996 A 4/2008

(Continued)

OTHER PUBLICATIONS

International Search Report & The Written Opinion of the International Searching Authority dated Sep. 23, 2010, International Application No. PCT/US2010/044317.

(Continued)

*Primary Examiner* — Ovidio Escalante
(74) *Attorney, Agent, or Firm* — Vierra Magen Marcus LLP

(57) ABSTRACT

Program disturb is reduced in a non-volatile storage system by programming storage elements on a selected word line WLn in separate groups, according to the state of their WLn−1 neighbor storage element, and applying an optimal pass voltage to WLn−1 for each group. Initially, the states of the storage elements on WLn−1 are read. A program iteration includes multiple program pulses. A first program pulse is applied to WLn while a first pass voltage is applied to WLn−1, a first group of WLn storage elements is selected for programming, and a second group of WLn storage elements is inhibited. Next, a second program pulse is applied to WLn while a second pass voltage is applied to WLn−1, the second first group of WLn storage elements is selected for programming, and the first group of WLn storage elements is inhibited. A group can include one or more data states.

13 Claims, 20 Drawing Sheets

(56) References Cited

U.S. PATENT DOCUMENTS

| | | | | |
|---|---|---|---|---|
| 7,196,928 | B2 | 3/2007 | Chen et al. | |
| 7,196,946 | B2 | 3/2007 | Chen et al. | |
| 7,295,478 | B2 * | 11/2007 | Wan et al. | 365/195 |
| 7,492,640 | B2 * | 2/2009 | Mokhlesi | 365/185.21 |
| 7,535,764 | B2 * | 5/2009 | Chin et al. | 365/185.2 |
| 7,636,260 | B2 * | 12/2009 | Higashitani | 365/185.24 |
| 7,715,235 | B2 * | 5/2010 | Cernea | 365/185.19 |
| 7,808,831 | B2 * | 10/2010 | Mokhlesi et al. | 365/185.21 |
| 7,894,269 | B2 * | 2/2011 | Li | 365/185.22 |
| 8,134,871 | B2 | 3/2012 | Dutta et al. | |
| 8,320,177 | B2 | 11/2012 | Dutta et al. | |
| 2007/0140013 | A1 | 6/2007 | Kwon et al. | |
| 2008/0019188 | A1 | 1/2008 | Li | |
| 2008/0084748 | A1 | 4/2008 | Hemink et al. | |
| 2008/0273388 | A1 * | 11/2008 | Chin et al. | 365/185.17 |
| 2008/0316811 | A1 * | 12/2008 | Higashitani | 365/185.02 |
| 2009/0059660 | A1 | 3/2009 | Lee et al. | |
| 2009/0073771 | A1 | 3/2009 | Li | |
| 2009/0168535 | A1 | 7/2009 | Kim et al. | 365/185.18 |
| 2009/0323412 | A1 * | 12/2009 | Mokhlesi et al. | 365/185.02 |

FOREIGN PATENT DOCUMENTS

| | | | |
|---|---|---|---|
| JP | 2009-048697 | A | 3/2009 |
| JP | 2009-520314 | A | 5/2009 |

OTHER PUBLICATIONS

Notice of Allowance dated Sep. 18, 2012, U.S. Appl. No. 13/370,410, filed Feb. 10, 2012.

Office Action Feb. 8, 2014, Chinese Patent Application No. 201080034585.9.

English Abstract of Chinese Publication No. CN1228600 published on Sep. 15, 1999.

Office Action dated Mar. 15, 2012, European Patent Application No. 10742064.8.

Response to Office Action dated Sep. 25, 2012, European Patent Application No. 10742064.8.

Office Action dated Oct. 29, 2013, Japanese Patent Application No. 2012-523718.

Response to Office Action dated Nov. 22, 2013, Japanese Patent Application No. 2012-523718.

English Abstract of Japanese Publication No. JP2009-048697 published on Mar. 5, 2009.

English Abstract of Japanese Publication No. JP2009-520314 published on May 21, 2009.

English Abstract of Japanese Publication No. JP2008-090996 published on Apr. 17, 2008.

International Search Report and the Written Opinion dated Sep. 23, 2010, International Appln. No. PCT/US2010/044317 filed Aug. 3, 2010.

* cited by examiner

PROGRAMMING MEMORY WITH REDUCED PASS VOLTAGE DISTURB AND FLOATING GATE-TO-CONTROL GATE LEAKAGE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, one issue which continues to be problematic is program disturb. Program disturb can occur at inhibited, unselected NAND strings during programming of other, selected NAND strings. Program disturb occurs when the threshold voltage of an unselected non-volatile storage element is shifted due to programming of other non-volatile storage elements. Program disturb can occur on previously programmed storage elements as well as erased storage elements that have not yet been programmed.

BRIEF DESCRIPTION OF THE DRAWINGS

FIG. 13b depicts a pulse train applied to an adjacent unselected word line during the program operation of FIG. 13a.

FIG. 14b depicts a pulse train applied to an adjacent unselected word line during the program operation of FIG. 14a.

FIG. 16a depicts different program pulse amplitudes which correspond to FIG. 13a.

FIG. 16b depicts different program pulse amplitudes which correspond to FIG. 14a.

FIG. 17b depicts different program pulse amplitudes which correspond to FIG. 17a.

FIG. 17c depicts a programming technique corresponding to FIG. 17a.

FIG. 17d depicts an alternative programming technique corresponding to FIG. 17a.

FIG. 18b depicts a pulse train applied to an adjacent unselected word line during the program operation of FIG. 18a.

FIG. 19 depicts a programming technique corresponding to FIG. 18a.

FIG. 20b depicts a programming technique corresponding to FIG. 20a.

FIG. 21b depicts a programming technique corresponding to FIG. 21a.

DETAILED DESCRIPTION

A method and non-volatile storage system are provided in which program disturb and degradation with program-erase cycles is reduced by optimally setting pass voltages on unselected word lines.

Storage elements on a selected word line WLn are programmed in separate groups, according to the state of their WLn−1 neighbor storage element. Moreover, an optimal pass voltage is applied to WLn−1 for each group. A group can include storage elements in one or more data states.

Figure 1A:
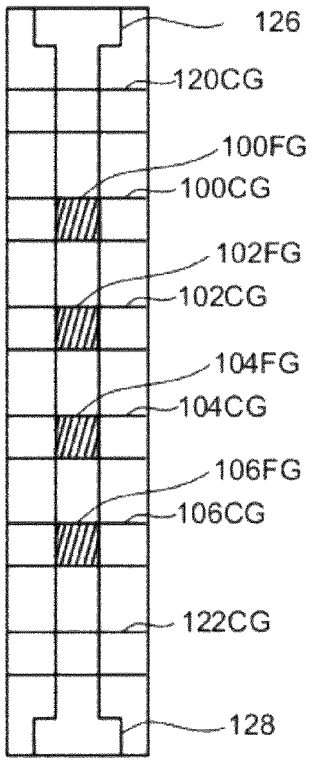
FIG. 1a is a top view of a NAND string.
Figure 1B:
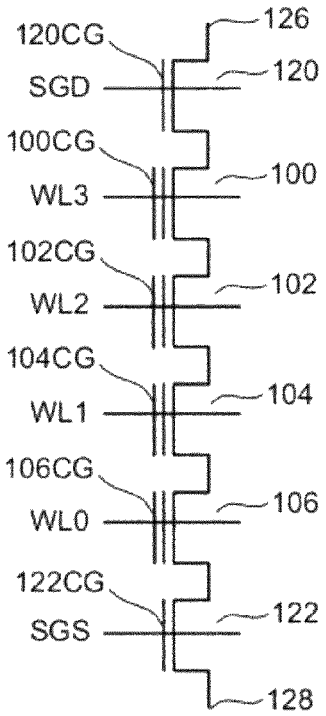
FIG. 1b is an equivalent circuit diagram of the NAND string.

One example of a suitable memory system uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
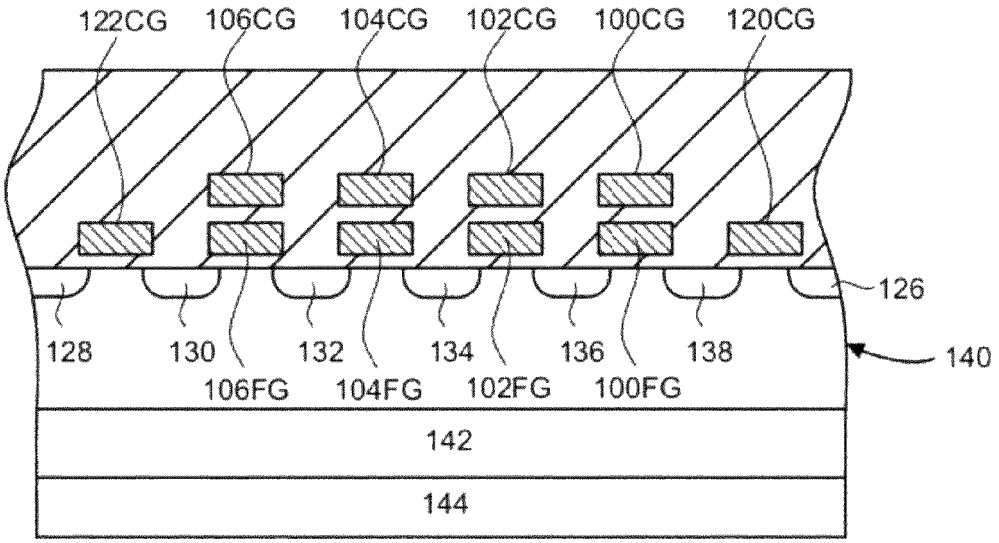
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a, 1b and 2 show four memory cells in the NAND string, a NAND string used with the technology described herein can have fewer than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semiconductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
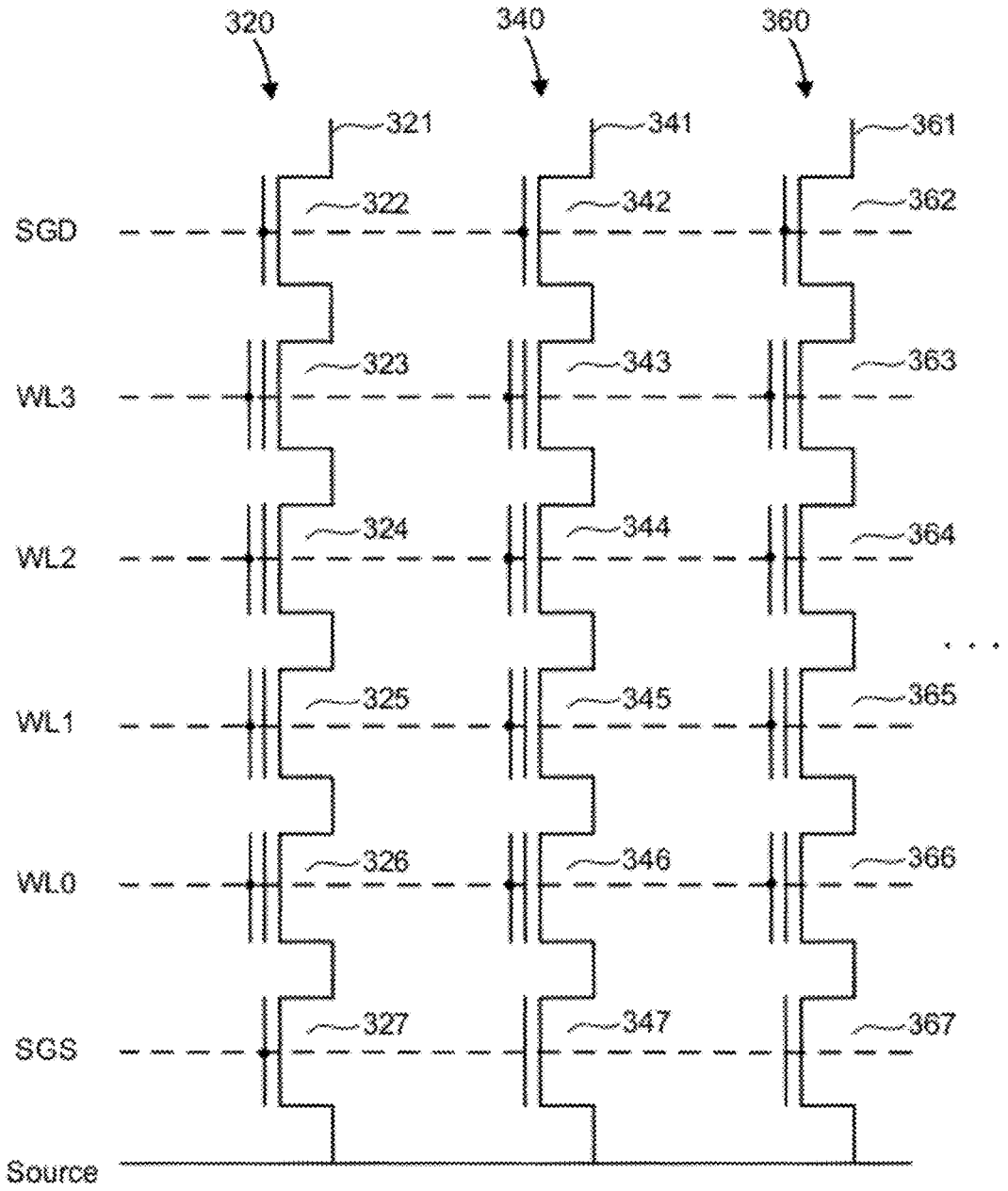
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages (Vth) of the storage element is divided into two ranges which are assigned logical data "1" and "0." In one example of a NAND type flash memory, the Vth is negative after the storage element is erased, and defined as logic "1." The Vth after a program operation is positive and defined as logic "0." When the Vth is negative and a read is attempted, the storage element will turn on to indicate logic "1" is being stored. When the Vth is positive and a read operation is attempted, the storage element will not turn on, which indicates that logic "0" is stored. A storage element can also store multiple levels of information, for example, multiple bits of digital data. In this case, the range of Vth value is divided into the number of levels of data. For example, if four levels of information are stored, there will be four Vth ranges assigned to the data values "11", "10", "01", and "00." In one example of a NAND type memory, the Vth after an erase operation is negative and defined as "11". Positive Vth values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the Vth of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, Vpass, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the Vth of a charge storage element due to capacitive coupling with other neighboring storage elements that are programmed later, can also contribute to program disturb.

Figure 4:
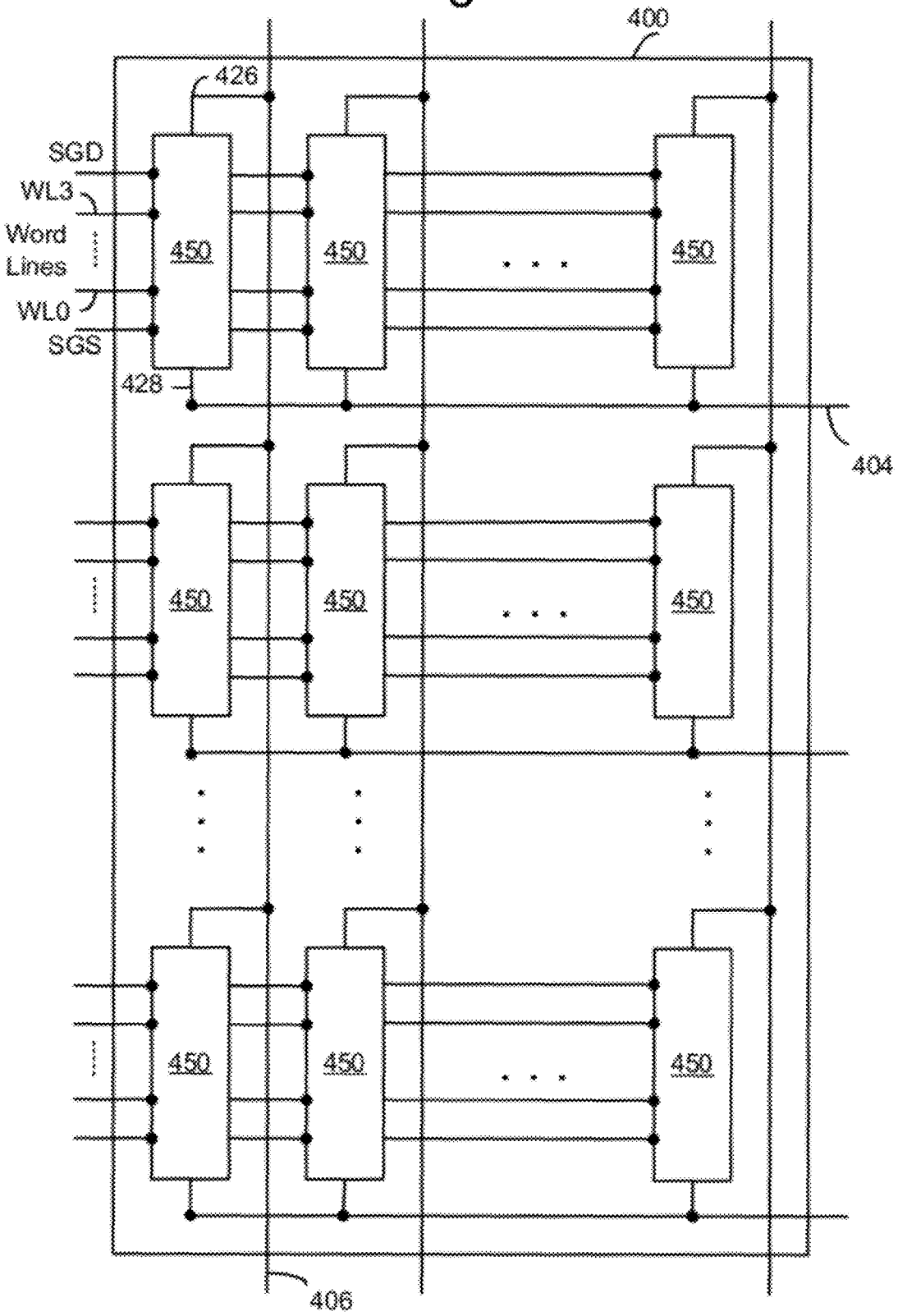
FIG. 4 is a block diagram of an array of NAND flash storage elements.

FIG. 4 illustrates an example of an array 400 of NAND storage elements, such as those shown in FIGS. 1a and 1b. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 5:
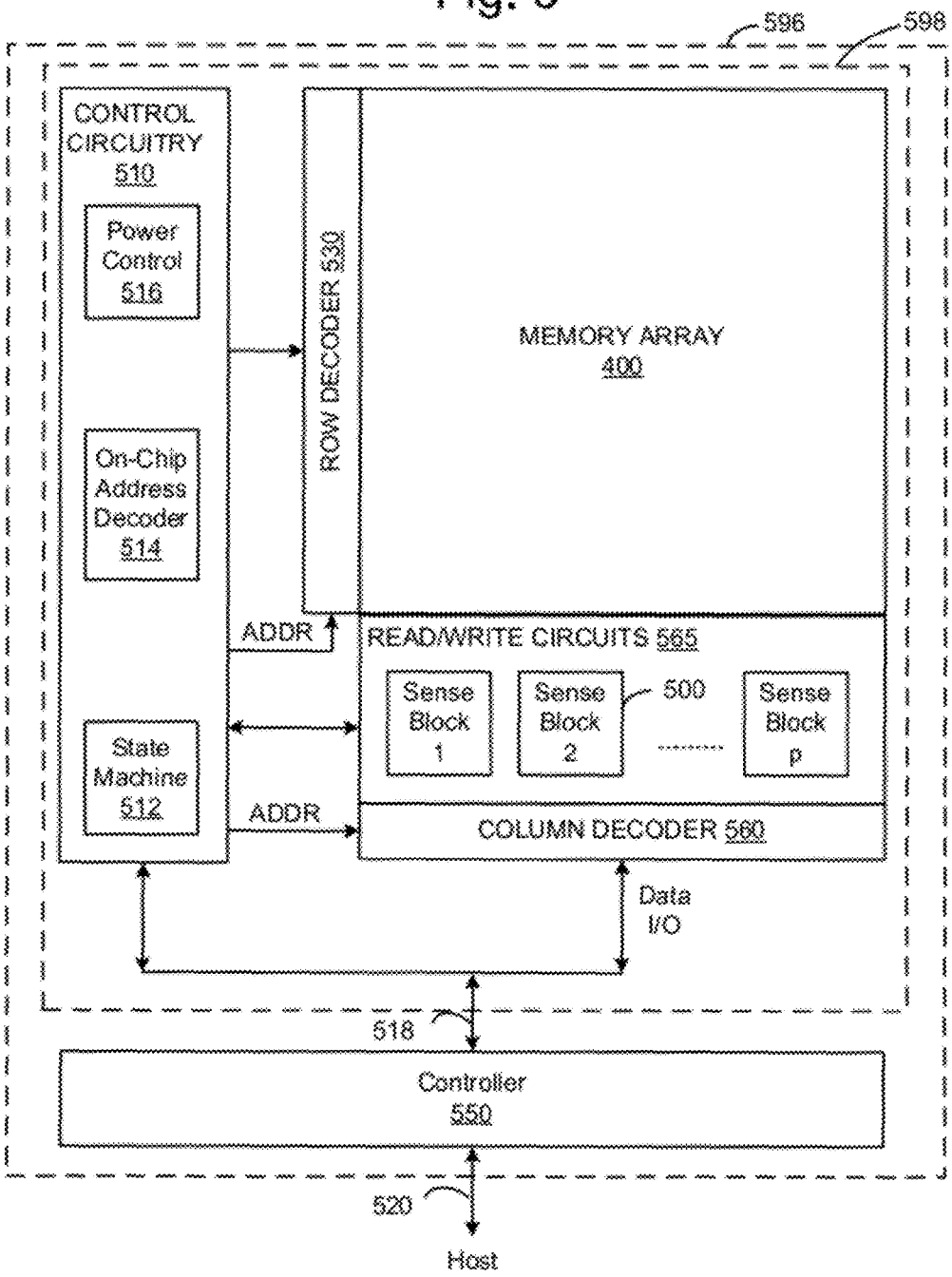
FIG. 5 is a block diagram of a non-volatile memory system using single row/column decoders and read/write circuits.

FIG. 5 is a block diagram of a non-volatile memory system using single row/column decoders and read/write circuits. The diagram illustrates a memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control 516, sense blocks 500, read/write circuits 565, controller 550, etc.

In another embodiment, a non-volatile memory system uses dual row/column decoders and read/write circuits. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
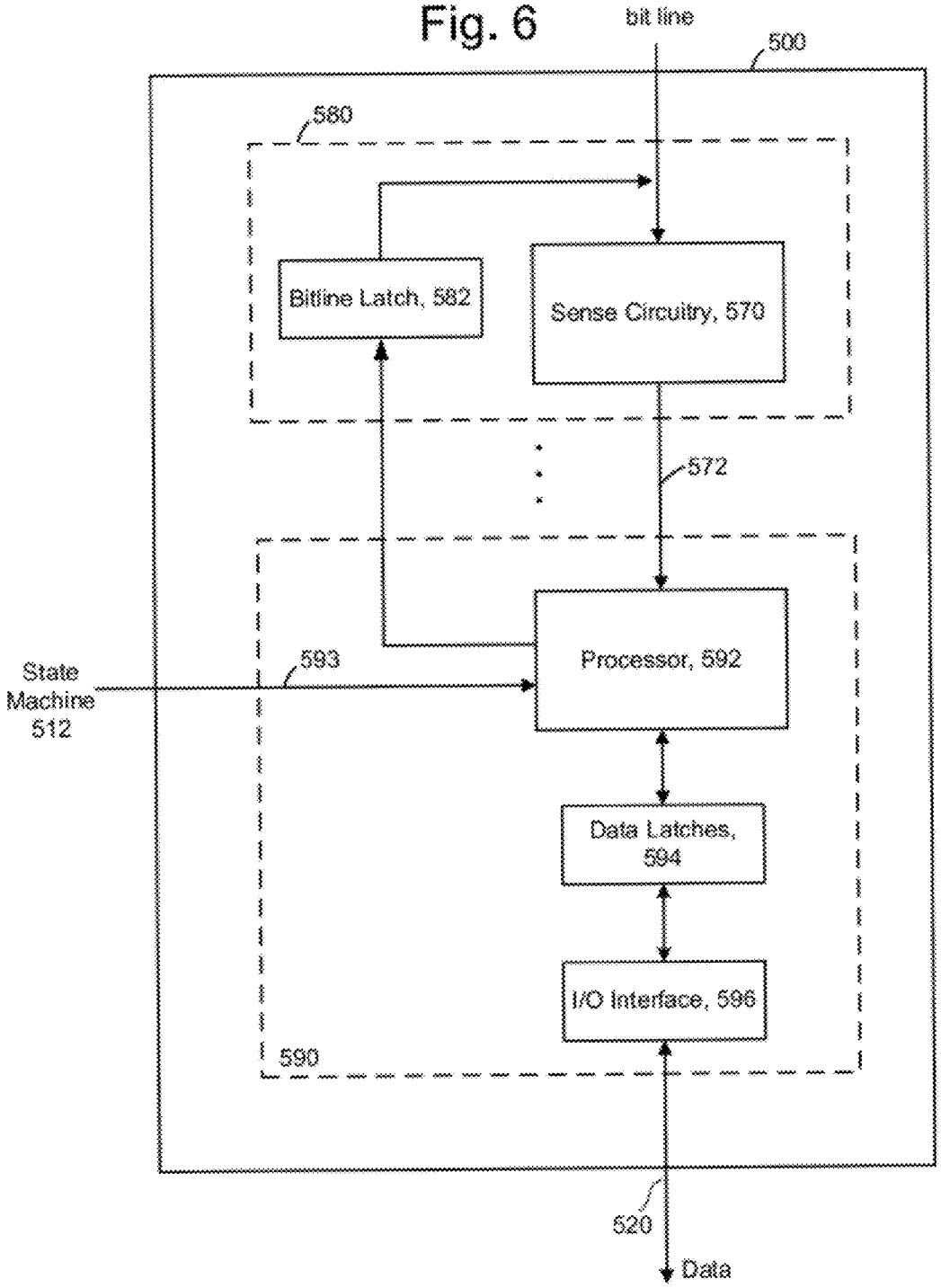
FIG. 6 is a block diagram depicting one embodiment of a sense block.

FIG. 6 is a block diagram depicting one embodiment of a sense block. An individual sense block 500 is partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 512 that controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594 from the data bus 520. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments the processor initially loads the bit line latch 582 and the sense circuitry sets it to an inhibit value during the verify process.

Data latch stack 594 contains a stack of data latches corresponding to the sense module. In one embodiment, there are three data latches per sense module 580. In some implementations (but not required), the data latches are implemented as a shift register so that the parallel data stored therein is converted to serial data for data bus 520, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7:
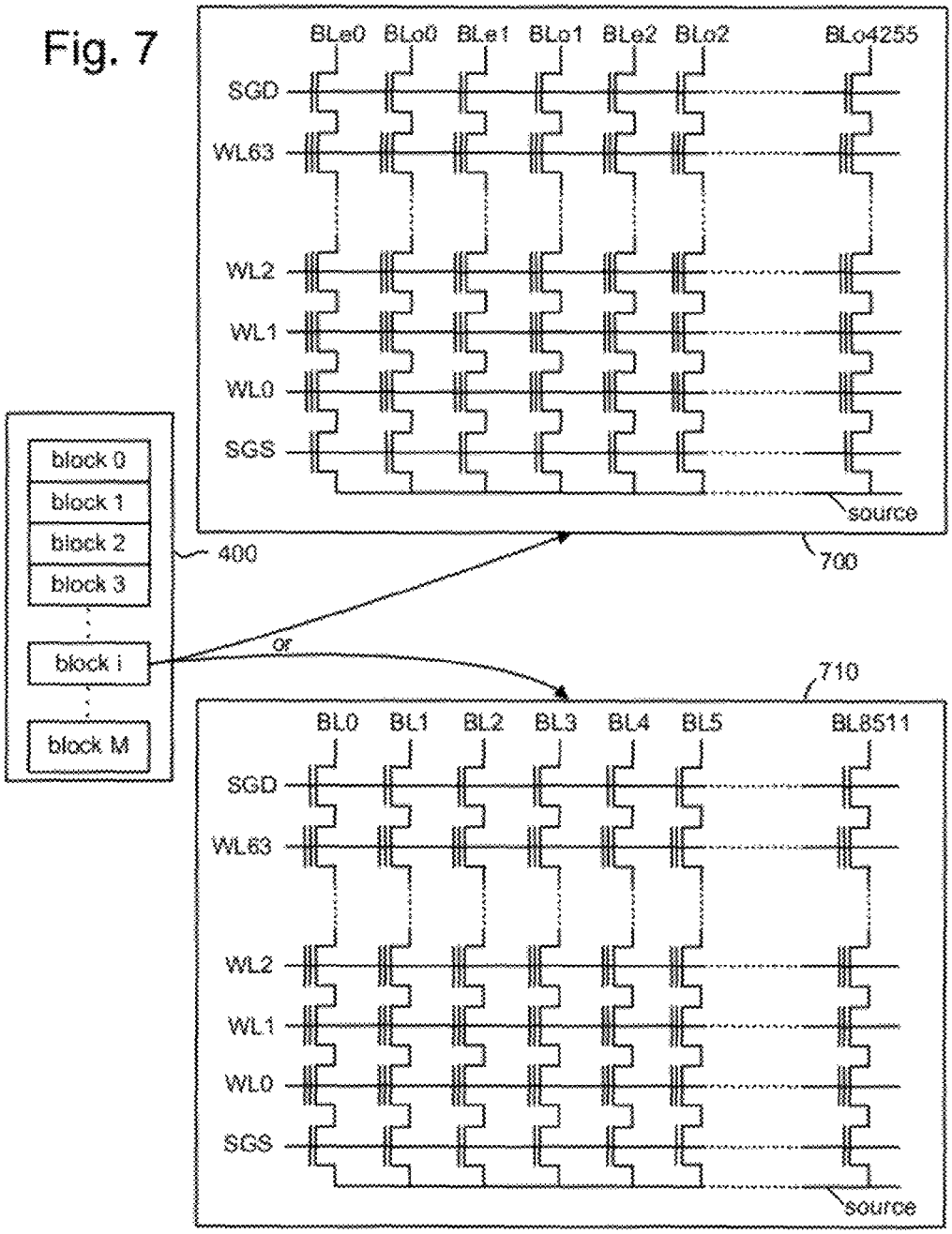
FIG. 7 illustrates an example of an organization of a memory array into blocks for an all bit line memory architecture or for an odd-even memory architecture.

FIG. 7 illustrates an example of an organization of a memory array into blocks for an all bit line memory architecture or for an odd-even memory architecture. Exemplary structures of memory array 400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 710), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 700), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and program operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the Vth of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a Vth of the concerned storage element is above or below such level. For example, in a read operation for a two-level storage element, the selected word line WL2 may be grounded, so that it is detected whether the Vth is higher than 0 V. In a verify operation for a two level storage element, the selected word line WL2 is connected to 0.8 V, for example, so that it is verified whether or not the Vth has reached at least 0.8 V. The source and p-well are at 0 V. The selected bit lines, assumed to be the even bit lines (BLe), are pre-charged to a level of, for example, 0.7 V. If the Vth is higher than the read or verify level on the word line, the potential level of the bit line (BLe) associated with the storage element of interest maintains the high level because of the non-conductive storage element. On the other hand, if the Vth is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

Figure 8:
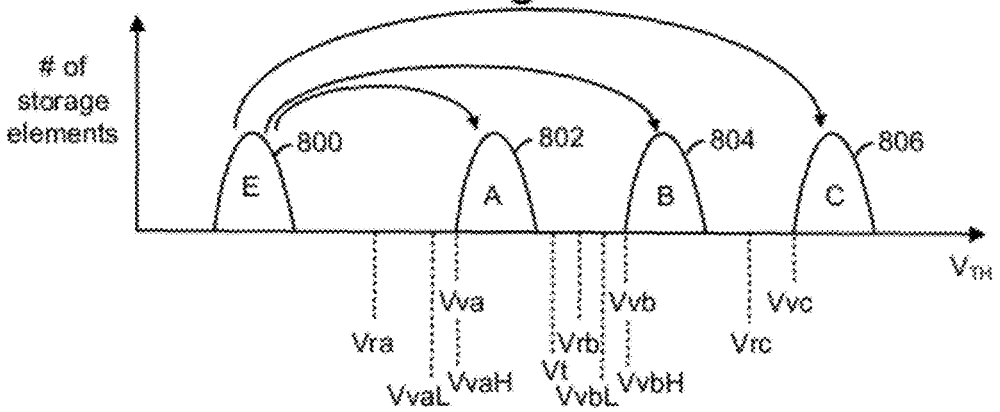
FIG. 8 depicts an example set of threshold voltage distributions and one-pass programming.

FIG. 8 depicts an example set of threshold voltage distributions and one-pass programming. Example threshold voltage distributions for the storage element array are provided for a case where each storage element stores two bits of data. A first threshold voltage distribution 800 is provided for erased (E state) storage elements. Three threshold voltage distributions 802, 804 and 806 represent programmed states A, B and C, respectively. In one embodiment, the threshold voltages in the E distribution are negative and the threshold voltages in the A, B and C distributions are positive.

The number of storage elements which are in a particular state can be determined by maintaining a count of storage elements whose threshold voltage is determined to exceed the corresponding verify level.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

Figure 16A:
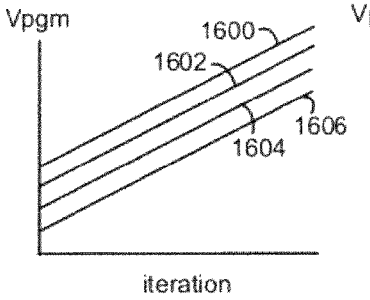

In one embodiment, known as full sequence programming, storage elements can be programmed from the erase state E directly to any of the programmed states A, B or C. For example, a population of storage elements to be programmed may first be erased so that all storage elements in the population are in erased state E. A series of program pulses such as depicted in FIG. 16a will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Vt represents a verify level which is not a verify level for a data state. It can be used as a trigger to start a second program phase, as discussed further below, e.g., in connection with FIGS. 16a and 16b. In this case, Vt is between Vva and Vvb, the verify levels for data states A and B, respectively.

Another option is to use low and high verify levels for one or more data states. For example, VvaL and VvaH are lower and higher verify levels for the A state, and VvbL and VvbH are lower and higher verify levels for the B state. During programming, when the threshold voltage of a storage element which is being programmed to the A state as a target state exceeds VvaL, the programming speed of the storage element is slowed down, such as by raising the associated bit line voltage to a level which is between a program or non-inhibit level and a full inhibit level. This provides greater accuracy by avoiding large step increases in threshold voltage. When the threshold voltage reaches VvaH, the storage element is locked out from further programming. Similarly, when the threshold voltage of a storage element which is being programmed to the B state as a target state exceeds VvbL, the programming speed of the storage element is slowed down, and when the threshold voltage reaches VvbH, the storage element is locked out from further programming. This programming technique has been referred to as a quick pass write or dual verify technique. Note that, in one approach, dual verify levels are not used for the highest state since some overshoot is typically acceptable. Instead, the dual verify levels can be used for the programmed states, above the erased state, and below the highest state.

Figure 9:
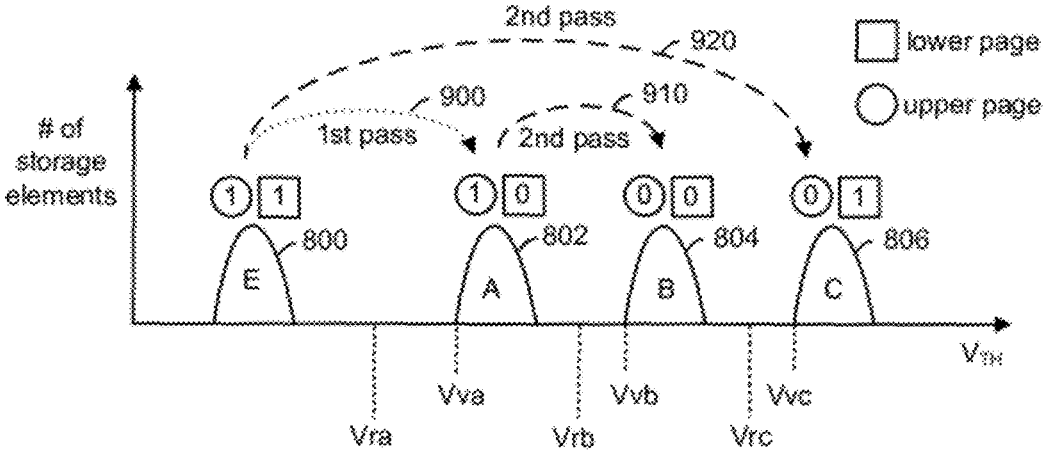
FIG. 9 depicts an example set of threshold voltage distributions and two-pass programming.

FIG. 9 illustrates an example of a two-pass technique of programming a multi-state storage element that stores data for two different pages: a lower page and an upper page. Four states are depicted by repeating the threshold voltage distributions 800, 802, 804 and 806 from FIG. 8. These states, and the bits they represent, are: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 900. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 920. If the storage element had been programmed into state A as a result of the first programming pass, then the storage element is further programmed in the second pass so that the threshold voltage is increased to be within state B, as depicted by arrow 910. The result of the second pass is to program the storage element into the state designated to store a logic "0" for the upper page without changing the data for the lower page. In both FIG. 8 and FIG. 9, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

Figure 10A:
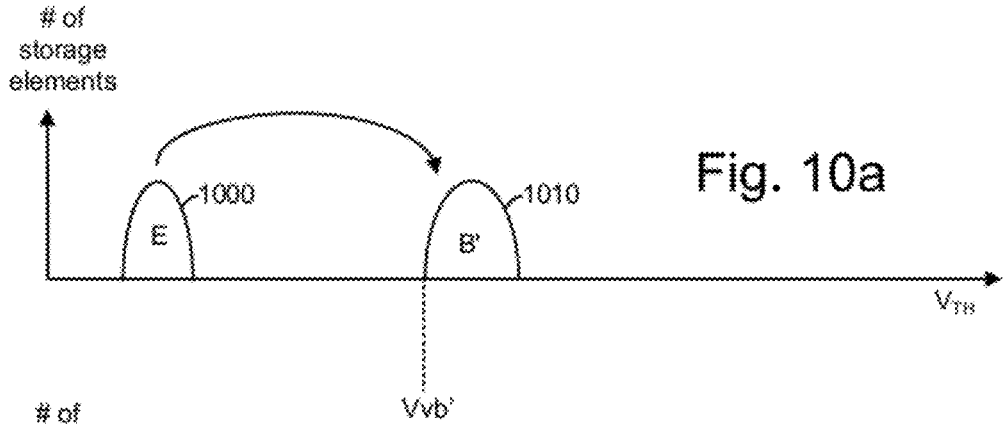
FIGS. 10a-c show various threshold voltage distributions and describe a process for programming non-volatile memory.
Figure 10B:
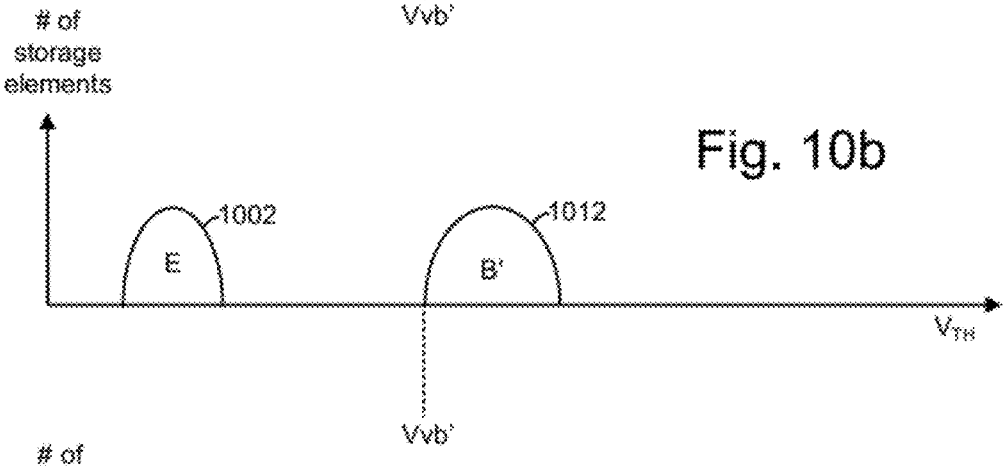
Figure 10C:
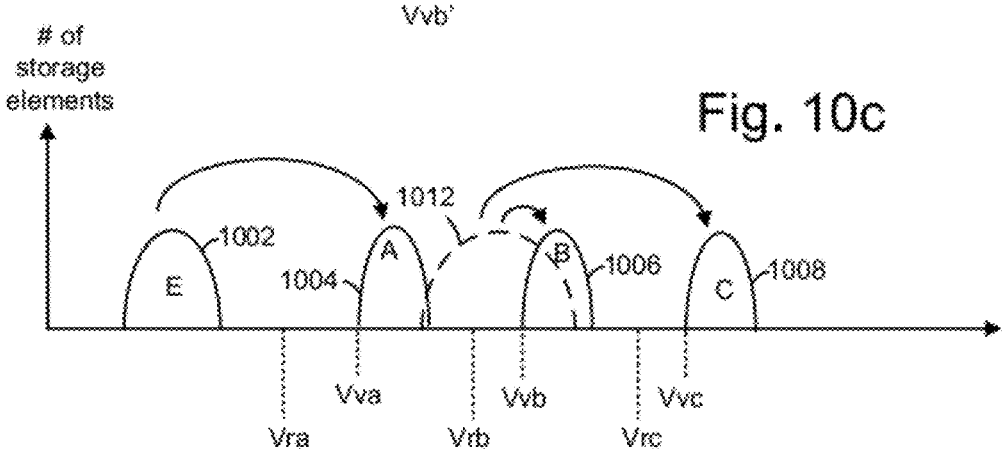

FIGS. 10a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E (distribution 1000). If the data is to be programmed to 0, then the threshold of voltage of the storage element is raised such that the storage element is programmed to state B' (distribution 1010). FIG. 10a therefore shows the programming of storage elements from state E to state B'. State B' is an interim state B; therefore, the verify point is depicted as Vvb', which is lower than Vvb.

Note that the distribution 1010 can have an associated temporary or interim distribution (not shown) which the B' state storage elements undergo before reaching the distribution 1010.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1012 of FIG. 10b. This apparent widening of the threshold voltage distribution will be remedied when programming the upper page. The E state may also be widened, to a lesser extent, as depicted by distribution 1002.

FIG. 10c depicts the process of programming the upper page. If the storage element is in erased state E and the upper page is to remain at 1, then the storage element will remain in state E (distribution 1002). If the storage element is in state E and its upper page data is to be programmed to 0, then the threshold voltage of the storage element will be raised so that the storage element is in state A (distribution 1004). If the storage element was in intermediate threshold voltage distribution 1012 and the upper page data is to remain at 1, then the storage element will be programmed to final state B (distribution 1006). If the storage element is in intermediate threshold voltage distribution 1012 and the upper page data is to become data 0, then the threshold voltage of the storage element will be raised so that the storage element is in state C (distribution 1008). The process depicted by FIGS. 10a-c reduces the effect of floating gate to floating gate coupling because only the upper page programming of neighbor storage elements will have an effect on the apparent threshold voltage of a given storage element. An example of an alternate state coding is to move from distribution 1012 to state C when the upper page data is a 1, and to move to state B when the upper page data is a 0.

Although FIGS. 10a-c provide an example with respect to four data states and two pages of data, the concepts taught can be applied to other implementations with more or fewer than four states and more or less than two pages. For example, memory devices with eight or sixteen states per storage element are currently planned or in production.

Figure 11:
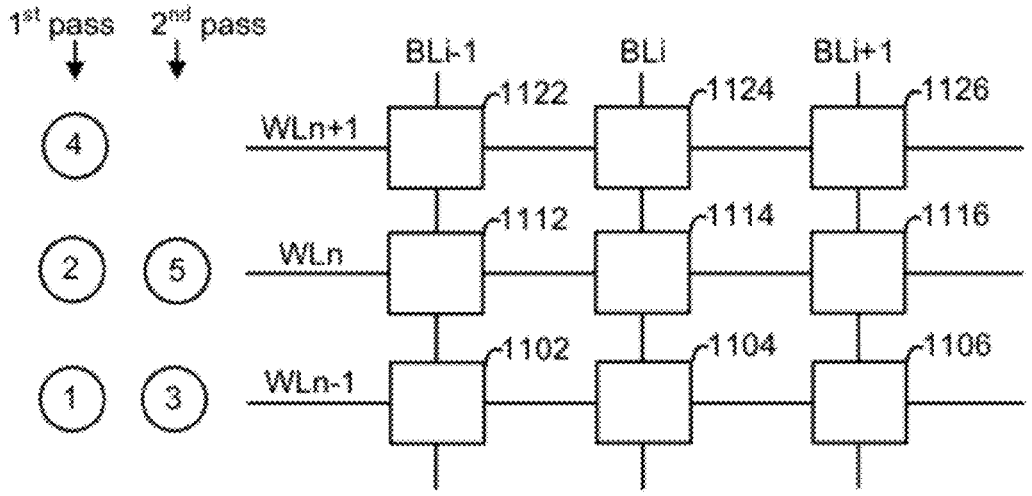
FIG. 11 depicts a multi-pass program operation for a set of storage elements.

FIG. 11 depicts a multi-pass program operation for a set of storage elements. The components depicted may be a subset of a much larger set of storage elements, word lines and bit lines. In one possible program operation, storage elements on WLn−1, e.g., storage elements 1102, 1104 and 1106, are programmed in a first programming pass. This step is represented by the circled "1." Next ("2"), storage elements on WLn, e.g., storage elements 1112, 1114 and 1116, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1 are programmed in a first programming pass. Next ("5"), the storage elements on WLn are programmed in a second programming pass to their final respective states.

Due to the programming on WLn+1, the storage elements on WLn are affected by coupling which tends to raise and widen their threshold voltage distribution for each state. This can occur during both single-pass and multi-pass programming. In single-pass pass programming, each word line is programmed completely before moving to the next word line, e.g., WLn−1, then WLn, then WLn+1.

Figure 12A:
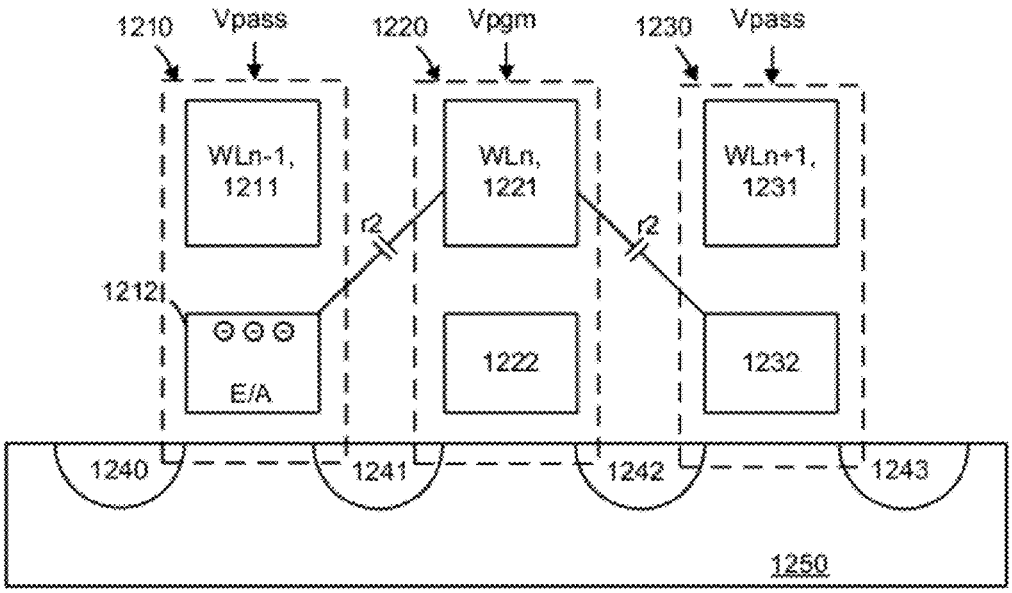
FIG. 12a depicts a cross-sectional view of a NAND string showing coupling of a program voltage from a control gate to the floating gates of adjacent storage elements which are in a relatively low state.

FIG. 12a depicts a cross-sectional view of a NAND string showing coupling of a program voltage from a control gate to the floating gates of adjacent storage elements which are in a relatively low state. A substrate 1250 includes source/drain regions 1240, 1241, 1242 and 1243. Storage elements 1210, 1220 and 1230 are formed on the substrate. Storage element 1210 includes a WLn−1 control gate 1211 and a floating gate 1212. Storage element 1220 includes a WLn control gate 1221 and a floating gate 1222. Storage element 1230 includes a WLn+1 control gate 1231 and a floating gate 1232. Storage element 1220 is being programmed and receives Vpgm via WLn, while storage elements 1210 and 1230 receive a pass voltage, Vpass.

As memory devices such as NAND devices are further scaled down, interference between storage elements plays an increasingly important role in determining the storage elements' characteristics. One of these interferences is word line-to-word line interference. Among other problems, this leads to two major problems during programming. First, during programming of WLn, the bias on WLn is Vpgm while the adjacent unselected word lines WLn−1 and WLn+1 are typically at a bias of Vpass. Sometimes, the unselected word lines are at different Vpass levels individually. Vpgm on word line/control gate 1221 couples to the floating gates 1212 and 1232 according to a coupling ratio r2, thereby raising the potential of the floating gates 1212 and 1232. This increases the probability of Vpass disturb on the WLn+1/n−1 storage elements. Although storage elements on every word line may be influenced to receive Vpass disturb, the Vpgm coupling to the adjacent floating gates makes them most susceptible to Vpass disturb. In particular, when the adjacent storage elements are at a relatively low state, such as the E or A state, there will be relatively few electrons in their floating gates, which results in a relatively higher potential for floating gate 1212. The coupling from the control gate 1221 will raise the floating gate potential high enough to cause program disturb which would lead to an increase in threshold voltage of the storage elements 1212 and 1232 so that an E state storage element may be read as an A state storage element (an E to A fail).

Due to their lower threshold voltage, the erased-state storage elements are much more susceptible to Vpass disturb than higher state storage elements such as C-state storage elements. Also, Vpass disturb mainly occurs in programming channels, e.g., in selected NAND strings, and not in inhibited channels (unselected NAND strings), which are boosted during programming. Due to the boosting, the field between the floating gate and the channel is much lower than in the programmed channel so that significant electron tunneling due to Vpass disturb does not occur. Lowering Vpass on WLn+1/n−1 can reduce the problem of Vpass disturb because it lowers the field between the floating gate and the channel. However, a lower Vpass also degrades program saturation on the WLn storage element. Thus, one Vpass level is not optimal for WLn−1/n+1 storage elements in different data states.

Figure 12B:
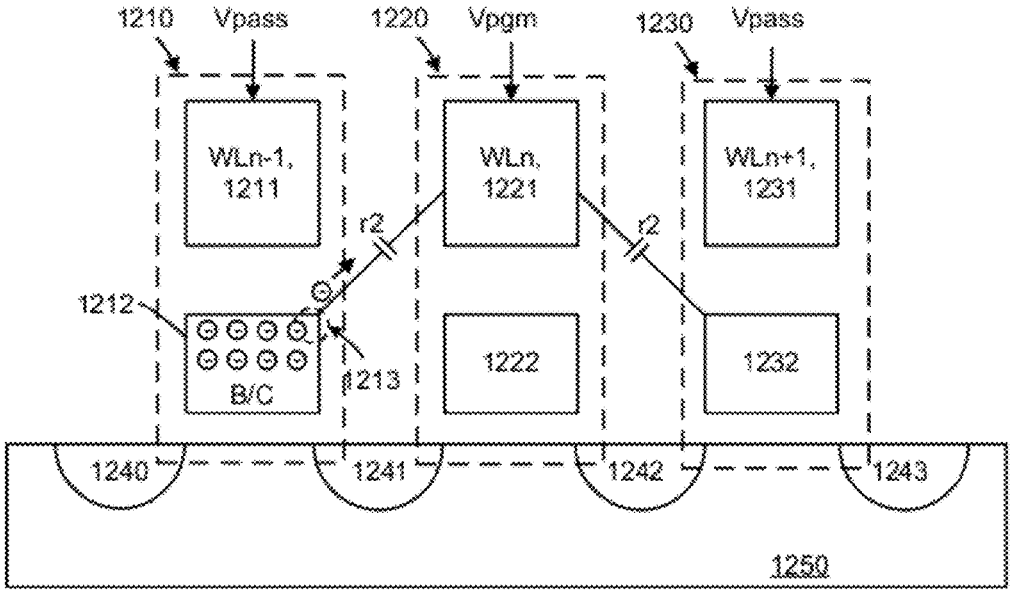
FIG. 12b depicts a cross-sectional view of a NAND string showing electron emission from the floating gates of adjacent storage elements which are in a relatively high state to a control gate which receives a program voltage.

FIG. 12b depicts a cross-sectional view of a NAND string showing electron emission from the floating gates of adjacent storage elements which are in a relatively high state to a control gate which receives a program voltage. Here, the floating gate 1212 has a region 1213 in which electrons are emitted due to a high Vpgm on the control gate 1221. In particular, during the few program pulses of a program operation, the Vpgm on WLn can reach relatively high values. If the potential difference between the WLn−1 floating gate 1212 and the control gate 1221 is high enough, an electric field can result which is strong enough to cause electron emission from the corner of the floating gate 1212 towards the control gate 1221. Moreover, the problem is much worse when the storage element 1210 is in the C state or other high data state due to the presence of relatively more electrons on the floating gate 1212 which lowers its potential, thus resulting in a stronger field for leakage. Such electron leakage can cause a program disturb which reduces the threshold voltage of the storage element. For example, a storage element in the C state may be read as if it were in the B state (a C to B fail). Note that the threshold voltage of a storage element decreases when the amount of charge in the floating gate decreases because the threshold voltage is the voltage which needs to be applied to the control gate of the storage element to cause a channel in the substrate below the floating gate to become conductive. As the amount of charge in the floating gate decreases, a smaller voltage applied to the control gate/word line is sufficient to cause the storage element to become conductive.

For inhibited channels, the boosted potential in the channel couples up to the WLn−1/n+1 floating gates 1212 and 1232 and thus raises the floating gates to a higher potential. This lowers the field between the floating gates 1212 and 1232 and the control gate 1221 and hence reduces floating gate-to-control gate leakage. Increasing Vpass on WLn−1 can also raise the floating gate potential and hence reduce this problem, but that also makes the storage elements more susceptible to Vpass disturb as described above. Thus, again, one Vpass level is not optimal for WLn−1/n+1 storage elements in different data states.

Figure 13A:
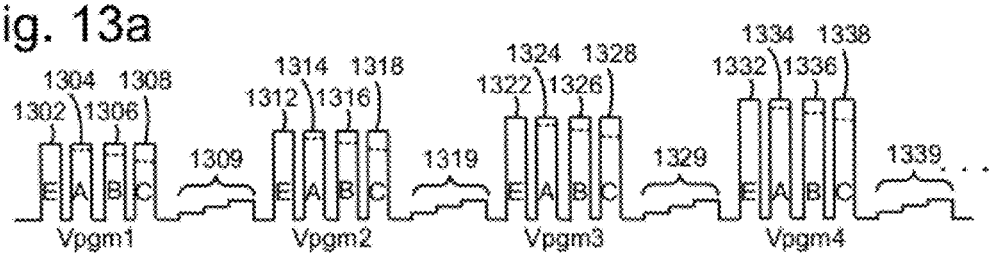
FIG. 13a depicts a pulse train applied to a selected word line during a program operation, in a first embodiment of a multi-pulse programming technique.

FIG. 13a depicts a pulse train applied to a selected word line during a program operation, in a first embodiment of a multi-pulse programming technique. Techniques described herein can reduce the floating gate-to-control gate leakage while, at the same time, improving Vpass disturb on WLn+1/n−1 storage elements. As mentioned, Vpass disturb on WLn+1/n−1 storage elements can be reduced by lowering Vpass on WLn+1/n−1. But, this comes at the cost of making program saturation worse.

In one possible approach, programming of storage elements is accomplished by using sets of program pulses, where each set includes multiple program pulses, and a verify operation follows each set of program pulses, but no verify operation is performed between program pulses in a set. In response to a command to begin a programming operation for storage elements associated with WLn, a sense/read operation is performed on WLn−1 to determine the states of the WLn−1 storage elements. The result of the read operation is preserved temporarily, such as in latches or other temporary memory locations, until programming of WLn is finished. The storage elements associated with WLn are then programmed separately in groups, one group at a time, based on the states of the WLn−1 storage elements, and one program pulse is applied separately for each group. Moreover, a group-specific pass voltage can be applied to WLn−1 during programming. T his approach can potentially allow a deeper erased state and a higher C-state, thus expanding the threshold voltage window.

In the example of FIG. 13a, the number of groups is the same as the number of possible data states of the storage elements on WLn−1. For example, with four possible states, E, A, B and C, there are four groups of storage elements, and each iteration of the program operation involves applying a set of four program pulses to WLn followed by one or more pulses of a verify operation. For instance, program pulses 1302, 1304, 1306 and 1308 are followed by verify pulses 1309; program pulses 1312, 1314, 1316 and 1318 are followed by verify pulses 1319; program pulses 1322, 1324, 1326 and 1328 are followed by verify pulses 1329; program pulses 1332, 1334, 1336 and 1338 are followed by verify pulses 1339, and so forth, until the program operation is completed. Performing a verify operation for all storage elements concurrently reduces programming time. The notation E, A, B or C in a program pulse indicates that the program pulse is used to program WLn storage elements whose WLn−1 adjacent neighbor is in the specified state.

The program pulses in a given set of program pulses may have the same or different amplitudes. In one possible approach, the program pulse amplitude decreases as the pass voltage on WLn−1 increases. This avoids abrupt changes in the effective Vpgm. Specifically, as the pass voltage increases (see FIG. 13b), Vpgm is stepped down, for a given set of program pulses. Thus, the amplitude of program pulse 1308 is lower than that of pulse 1306, the amplitude of program pulse 1306 is lower than that of pulse 1304, and the amplitude of program pulse 1304 is lower than that of pulse 1302. The program pulses may still increase incrementally from set to set. Thus, the amplitude of program pulse 1318 is higher than that of pulse 1308, the amplitude of program pulse 1316 is higher than that of pulse 1306, and so forth. Optional stepped down Vpgm amplitudes are depicted by dashed lines in FIGS. 13a, 14a, 16c, 17a, 18a and 20a.

Figure 13B:
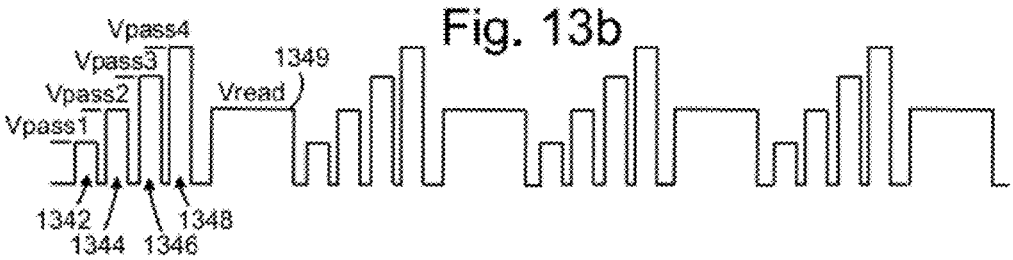

While the program pulses of FIG. 13a are applied to WLn, associated pass voltages are applied to WLn−1 as depicted by FIG. 13b.

FIG. 13b depicts a pulse train applied to an adjacent unselected word line during the program operation of FIG. 13a. The pulse train of FIG. 13b is time-aligned with the pulse train of FIG. 13a. The pulse trains herein are not necessarily to scale in terms of time and/or amplitude. For each program pulse, a corresponding pass voltage is applied to WLn−1. The nominal Vpass can be applied to the non-adjacent unselected storage elements, in one possible approach. Specifically, pass voltages with amplitudes of Vpass1 (1342), Vpass2 (1344), Vpass3 (1346) and Vpass4 (1348) are applied to WLn−1 when program pulses 1302, 1304, 1306 and 1308, respectively, are applied to WLn, where Vpass1<Vpass2<Vpass3<Vpass4.

In a time period in which Vpass1 (1342) is applied to WLn−1, program pulse 1302 is applied to WLn, and a first group of storage elements on WLn whose WLn−1 neighbors are in the E state are programmed, while second, third and fourth groups of storage elements on WLn whose WLn−1 neighbors are in the A, B or C state, respectively, are inhibited. In a time period in which Vpass2 (1344) is applied to WLn−1, program pulse 1304 is applied to WLn, and the second group of storage elements on WLn are programmed, while the first, third and fourth groups of storage elements on WLn are inhibited. In a time period in which Vpass3 (1346) is applied to WLn−1, program pulse 1306 is applied to WLn, and the third group of storage elements on WLn are programmed, while the first, second and fourth groups of storage elements on WLn are inhibited. In a time period in which Vpass4 (1348) is applied to WLn−1, program pulse 1308 is applied to WLn, and the fourth group of storage elements on WLn are programmed, while the first, second and third groups of storage elements on WLn are inhibited.

A read voltage Vread 1349 is applied to WLn−1 and other unselected word lines during a verify operation. As mentioned, one group of storage elements on WLn is selected for programming for each program pulse and corresponding pass voltage. When the storage elements are arranged in series-connected strings such as NAND strings, a storage element can be selected for programming by selecting the corresponding string or bit line. This may include applying 0 V to the bit line. Similarly, a storage element can be inhibited from being programmed by inhibiting the corresponding string or bit line, such as by applying a raised voltage to the bit line which is sufficient to render the associated drain side selected gate non-conductive.

Note that the pass voltages can be applied in different orders. Lowest to highest (e.g., Vpass1, Vpass2, Vpass3, Vpass4) is one option. Highest to lowest (e.g., Vpass4, Vpass3, Vpass2, Vpass1) is another option. Other more randomized orders are acceptable as well. Thus, the order in which the storage elements are selected and inhibited, within a set of program pulses, can vary and is not constrained to any particular order.

Figure 13C:
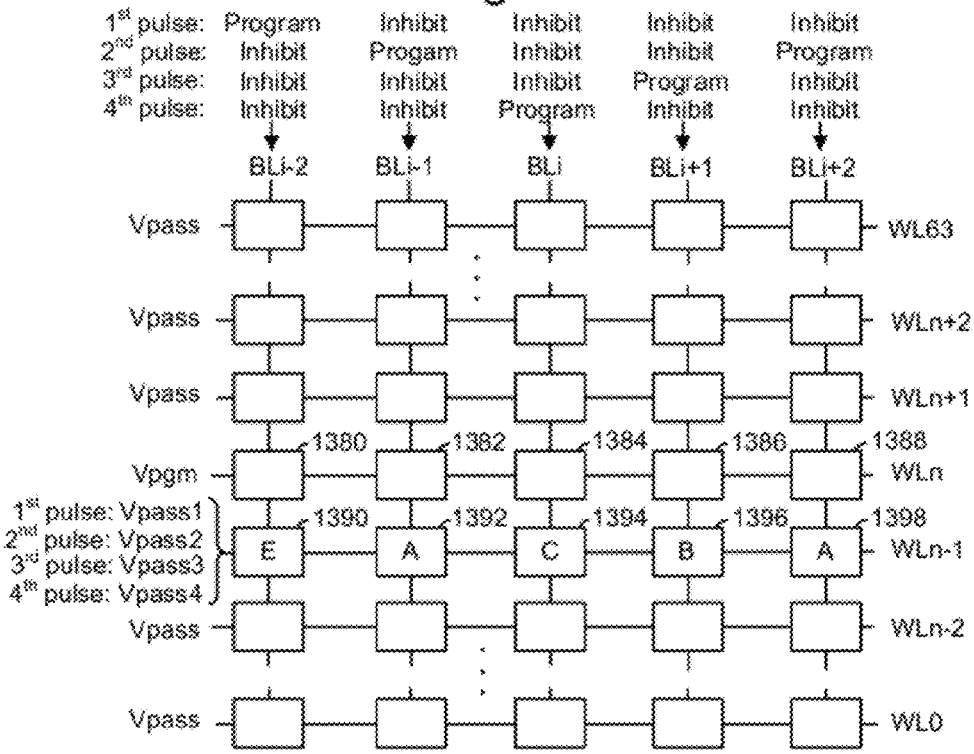
FIG. 13c depicts an example application of the first embodiment of a multi-pulse programming technique, as applied to a set of storage elements.

FIG. 13c depicts an example application of the first embodiment of a multi-pulse programming technique, as applied to a set of storage elements. A block of storage elements are arranged in word lines WL0 through WL63, for instance, and in example bit lines BLi-2, BLi-1, BLi, BLi+1 and BLi+2. WL0-WLn−2 are source side non-adjacent, unselected word lines, relative to WLn, and WLn+2-WL63 are drain side non-adjacent, unselected word lines, relative to WLn. WLn, the currently selected word line, is in communication with example storage elements 1380, 1382, 1384, 1386 and 1388. WLn−1, the source side adjacent word line of WLn, is in communication with example storage elements 1390, 1392, 1394, 1396 and 1398. Storage elements 1390, 1392, 1394, 1396 and 1398 are directly adjacent to, and on the same bit line or NAND string as, storage elements 1380, 1382, 1384, 1386 and 1388, respectively.

As an illustration, assume storage elements 1390, 1392, 1394, 1396 and 1398 are in the E, A, C, B and A states, respectively.

During the first program pulse of each set of program pulses, e.g., during program pulses 1302, 1312, 1322 and 1332, the storage elements in WLn which are adjacent to E-state storage elements on WLn−1 are selected for programming. Here, storage element 1380 is selected for programming. BLi−2 is in a set of bit lines which is selected. That is, storage element 1380 is allowed to be programmed by configuring the NAND string to allow programming, unless storage element 1380 has completed programming. The other storage elements on WLn are inhibited from being programmed. That is, they are not allowed to be programmed by configuring the NAND string to not allow programming. These storage elements are associated with at least one group of bit lines (including BLi−1, BLi, BLi+1 and BLi+2) which are inhibited. At this time, the lowest pass voltage, Vpass1, is applied to WLn−1. This is optimal since a low pass voltage deters Vpass disturb when the WLn−1 storage element is in a low state.

During the second program pulse of each set, e.g., during program pulses 1304, 1314, 1324 and 1334, the storage elements in WLn which are adjacent to A-state storage elements on WLn−1 are selected for programming. Here, storage elements 1382 and 1388 are selected for programming. These storage elements are associated with one or more groups of bit lines (including BLi−1 and BLi+2) which are selected. The other storage elements on WLn are inhibited from being programmed. These storage elements are associated with one or more groups of bit lines (including BLi−2, BLi and BLi+1) which are inhibited. At this time, the next lowest pass voltage, Vpass2, is applied to WLn−1. The pass voltage is optimal since it is tailored to the state of the WLn−1 storage element.

During the third program pulse of each set, e.g., during program pulses 1306, 1316, 1326 and 1336, the storage elements in WLn which are adjacent to B-state storage elements on WLn−1 are selected for programming. Here, storage element 1386 is selected for programming. This storage element is associated with one or more groups of bit lines (including BLi+1) which are selected. The other storage elements on WLn are inhibited from being programmed. These storage elements are associated with one or more groups of bit lines (including BLi−2, BLi−1, BLi and BLi+2) which are inhibited. At this time, the next lowest pass voltage, Vpass 3, is applied to WLn−1.

During the fourth program pulse of each set, e.g., during program pulses 1308, 1318, 1328 and 1338, the storage elements in WLn which are adjacent to C-state storage elements on WLn−1 are selected for programming. Here, storage element 1384 is selected for programming. This storage element is associated with one or more groups of bit lines (including BLi) which are selected. The other storage elements on WLn are inhibited from being programmed These storage elements are associated with one or more groups of bit lines including (BLi−2, BLi−1, BLi+1 and BLi+2) which are inhibited. At this time, the highest pass voltage, Vpass4, is applied to WLn−1.

Note that the example applied to a memory device with four data states, but can be extended for use with additional data states.

While this approach is optimal in that it provides a pass voltage which is tailored to each different possible data state on WLn−1, it extends the programming time. Another possible approach, described next, groups the WLn−1 storage elements with multiple data states per group, for one or more groups, so that the number of program pulses per iteration is reduced.

Figure 14A:
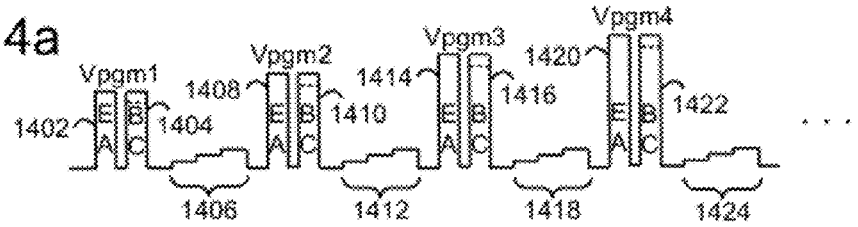
FIG. 14a depicts a pulse train applied to a selected word line during a program operation, in a second embodiment of a multi-pulse programming technique.

FIG. 14a depicts a pulse train applied to a selected word line during a program operation, in a second embodiment of a multi-pulse programming technique. In this approach, the two lowest states, states E and A are grouped, and the two highest states, states B and C are grouped. Thus, when WLn−1 is read in connection with a program operation on WLn, storage elements on WLn−1 which are in states E and A are grouped, and storage elements on WLn−1 which are in states B and C are grouped. This approach compresses the number of different pass voltages for efficiency while still tailoring the pass voltage amplitude to the states of the WLn−1 storage elements. Other possible groupings are possible. For example, state E may be in one group while states A, B and C are in another group. When there are more than four data states, the number of possible groups expands. For example, with eight data states E, A, B, C, D, E, F and G, two groups may be used, where a first group may include states E and A, and a second group may include states B, C, D, E, F and G. Or, three groups may be used, where a first group may include states E and A, a second group may include states B, C, D, E and a third group may include states F and G. Other variations are possible. Testing of particular memory devices can determine which groupings are optimal.

In the approach where states E and A are grouped, and states B and C are grouped, a first iteration of the program operation includes a set of two program pulses 1402 and 1404 followed by one or more verify pulses 1406. The first program pulse is used to program WLn storage elements whose WLn−1 adjacent neighbor is in the E or A state. The second program pulse is used to program WLn storage elements whose WLn−1 adjacent neighbor is in the B or C state. Similarly, program pulses 1408 and 1410 are followed by verify pulses 1412, program pulses 1414 and 1416 are followed by verify pulses 1418, and program pulses 1420 and 1422 are followed by verify pulses 1424. The option of using a stepped down Vpgm when Vpass is higher is depicted by the dashed lines.

Figure 14B:
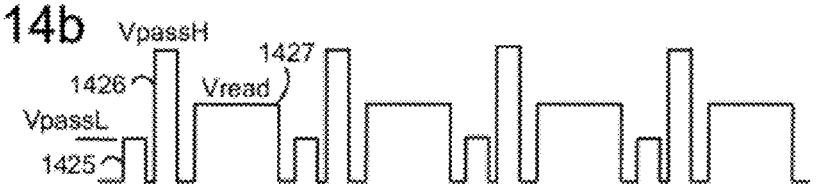

FIG. 14b depicts a pulse train applied to an adjacent unselected word line during the program operation of FIG. 14a. FIG. 14b is time aligned with FIG. 14a. When program pulse 1402 is applied, a pass voltage 1425 at a relatively low amplitude of VpassL is applied to WLn−1. When program pulse 1404 is applied, a pass voltage 1426 at relatively high amplitude of VpassH is applied to WLn−1. When verify voltages 1406 are applied to WLn, Vread 1427 is applied to WLn−1 and other unselected word lines. The sequence of pass voltages is repeated for the remaining program iterations.

Thus, in a time period in which VpassL (1425) is applied to WLn−1, program pulse 1402 is applied to WLn, and a first group of storage elements on WLn whose WLn−1 neighbors are in the E or A state are programmed, while a second group of storage elements on WLn whose WLn−1 neighbors are in the B or C state are inhibited. In a time period in which VpassH (1426) is applied to WLn−1, program pulse 1404 is applied to WLn, and the second group of storage elements on WLn are programmed, while the first group of storage elements on WLn are inhibited.

Figure 14C:
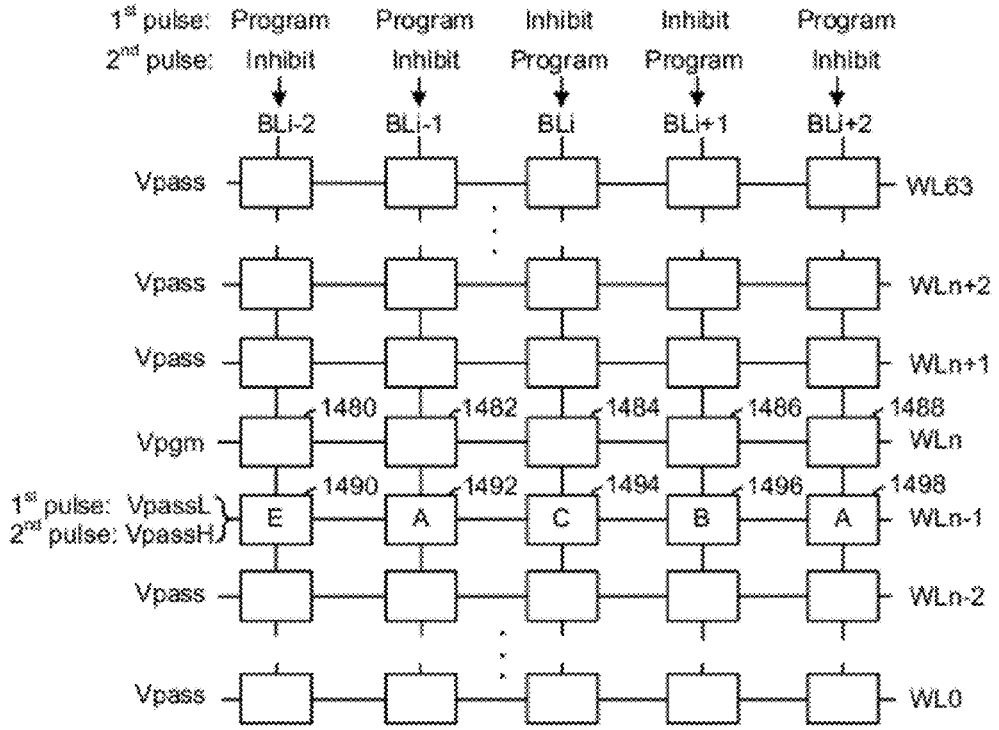
FIG. 14c depicts an example application of the second embodiment of a multi-pulse programming technique, as applied to a set of storage elements.

FIG. 14c depicts an example application of the second embodiment of a multi-pulse programming technique, as applied to a set of storage elements. Similar to FIG. 13c, WLn, the currently selected word line, is in communication with example storage elements 1480, 1482, 1484, 1486 and 1488, and WLn−1 is in communication with example storage elements 1490, 1492, 1494, 1496 and 1498. During the first program pulse 1402, 1408, 1414 and 1420 of each program iteration, the storage elements in WLn which are adjacent to E- or A-state storage elements on WLn−1 are selected for programming. Here, storage elements 1480 (BLi−2), 1482 (BLi−1) and 1488 (BLi+2) are selected for programming. At this time, VpassL is applied to WLn−1. During the second program pulse 1404, 1410, 1416 and 1422 of each program iteration, the storage elements in WLn which are adjacent to B- or C-state storage elements on WLn−1 are selected for programming. Here, storage elements 1484 (BLi) and 1486 (BLi+1) are selected for programming. At this time, VpassH, is applied to WLn−1.

Figure 15:
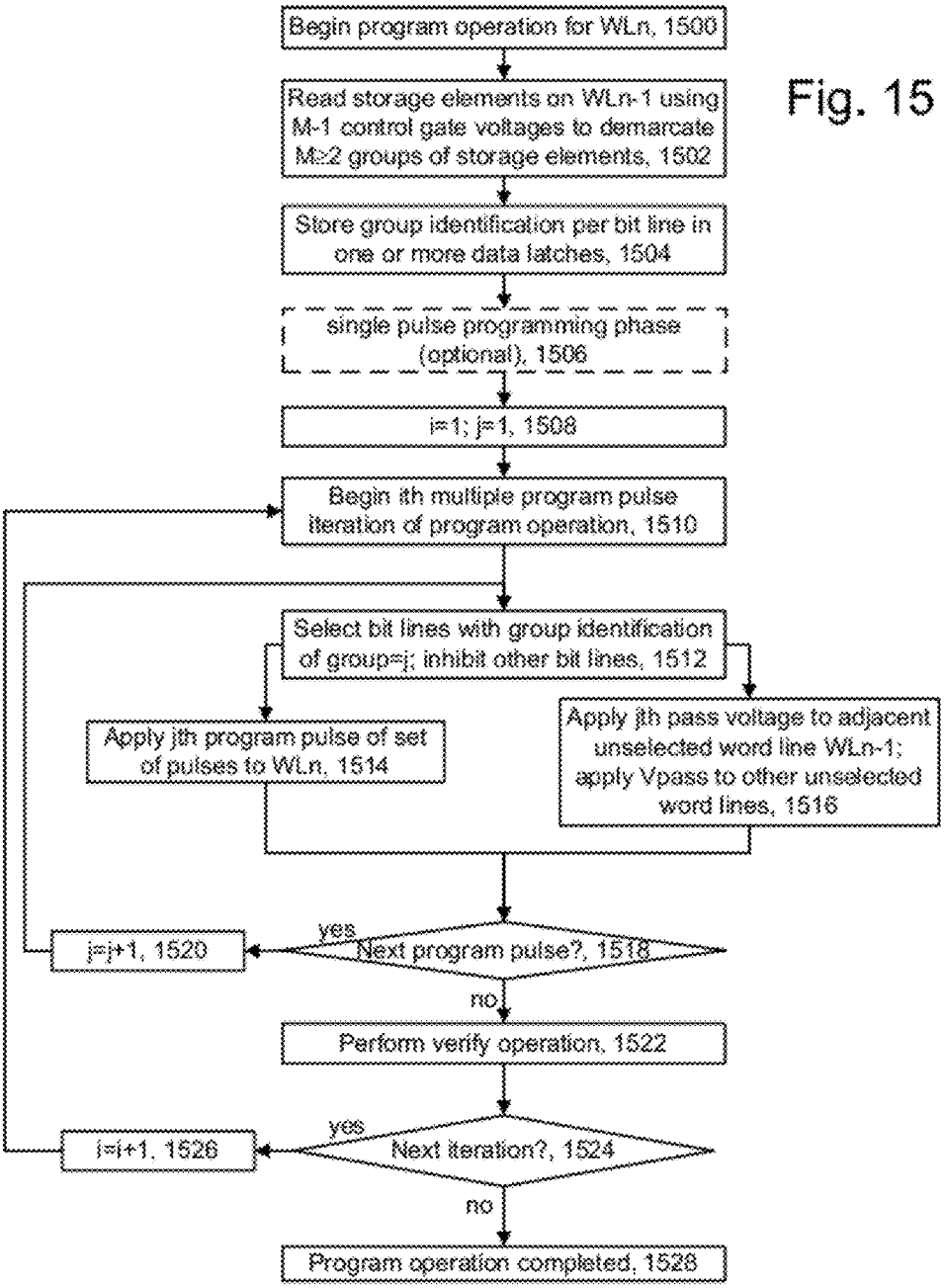
FIG. 15 depicts a programming technique corresponding to FIGS. 13a-14c.

FIG. 15 depicts a programming technique corresponding to FIGS. 13a-14c. At step 1500, a program operation for WLn begins, such in response to a program command which is received at a controller of a memory device from a host. In response to the program command, at step 1502, the storage elements on WLn−1 are read using M−1 control gate voltages to demarcate only M≥2 groups of storage elements. Furthermore, the storage elements on the adjacent word line can store data in at least M+1 data states. For example, FIG. 13a uses M=4, and three control gate voltages are used to demarcate four groups of storage elements. FIG. 14a uses M=2, and one control gate voltage is used to demarcate two groups of storage elements. The control gate voltage is a sense voltage which is used to identifying at least a first group of non-volatile storage elements on the adjacent word line whose threshold voltages fall below the sense voltage (that is, storage elements which are non-conductive when the sense voltage is applied), and a second group of non-volatile storage elements on the adjacent word line whose threshold voltages exceed the sense voltage (that is, storage elements which are conductive when the sense voltage is applied).

At step 1504, group identification is stored for each bit line or NAND string in one or more data latches. Generally, in a memory device, a number of data latches, each storing one bit, may be provided for each bit line. Depending on the design, there may be a sufficient number of latches available to store the group identification. With one bit per latch, K≥1 latches per bit line are used to store K bits of data to identify $2^K$=M different groups. For example, K=1 when M=2, and K=2 when M=4. With M=2, a 0 bit may denote the E or A state, and a 1 bit may denote the B or C state. With M=4, the combination of a 0 bit in one latch (latch1) and a 0 bit in another latch (latch2) may denote the E state, the combination of a 0 bit in latch1 and a 1 bit in latch2 may denote the A state, the combination of a 1 bit in latch1 and a 0 bit in latch2 may denote the B state, and the combination of a 1 bit in latch1 and a 1 bit in latch2 may denote the C state.

At optional step 1506, a single-pulse programming phase, described further below in connection with FIGS. 17a-d may be used. This approach delays the use of the multiple-pulse programming technique until partway through the program operation, when the higher program voltages are used, and results in a shorter program time while still preserving the benefits of using different pass voltages based on the WLn−1 storage element data state.

At step 1508, a program iteration index i and a program pulse index j are set to one. At step 1510, the ith multiple program pulse iteration of the program operation begins. At step 1512, a group of bit lines which are associated with a jth group of the WLn−1 storage elements is selected for programming while all other groups of bit lines are inhibited. At step 1514, the jth program pulse of a set of program pulses is applied to WLn, while at step 1516, a jth pass voltage is applied to the adjacent unselected word line WLn−1, and Vpass is applied to the other unselected word lines. At decision step 1518, if there is a next program pulse in the set of program pulses, j is incremented at step 1520 and steps 1512, 1514 and 1516 are repeated for a next group of bit lines. At decision step 1518, if there is no next program pulse in the set of program pulses, a verify operation is performed at step 1522. At decision step 1524, if there is a next iteration of the program operation, is incremented at step 1526 and steps 1510, 1512, 1514 and 1516 are repeated. At decision step 1524, if there is no next iteration of the program operation, the program operation is completed, at step 1528.

FIG. 16a depicts different program pulse amplitudes which correspond to FIG. 13a. As previously mentioned, the amplitude of Vpgm can be higher when the amplitude of the pass voltage on WLn−1 is lower. Likewise, the amplitude of Vpgm can be lower when the amplitude of the pass voltage on WLn−1 and WLn+1 is higher. The x-axis depicts a number of program iterations in a program operation, and the y-axis depicts Vpgm. Lines 1600, 1602, 1604 and 1606 may be used to set Vpgm for a given iteration and pass voltage. Specifically, curve 1600, 1602, 1604 or 1606 is used when Vpass1, Vpass2, Vpass3 or Vpass4, respectively, is used.

Figure 16B:
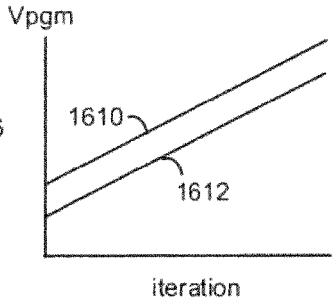

FIG. 16b depicts different program pulse amplitudes which correspond to FIG. 14a. Curve 1610 or 1612 is used to set Vpgm for a given iteration when VpassL or VpassH, respectively, is used.

Figure 16C:
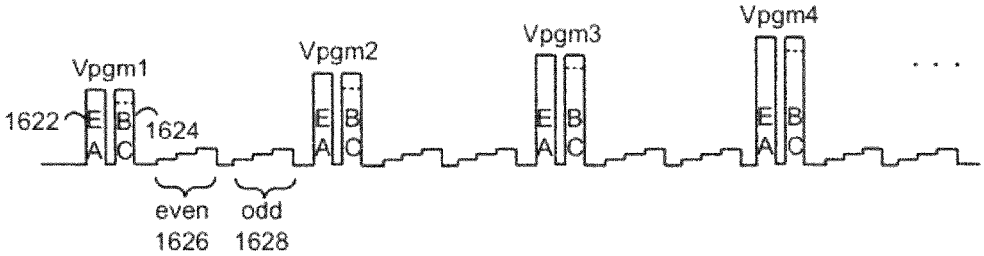
FIG. 16c depicts a pulse train applied to a selected word line during a program operation, in a third embodiment of a multi-pulse programming technique.

FIG. 16c depicts a pulse train applied to a selected word line during a program operation, in a third embodiment of a multi-pulse programming technique. In this example, verify operations are performed separately for even and odd numbered bit lines. This is useful for memory devices which have an odd-even sensing capability, but not an all bit line sensing capability. Specifically, in the example where one program pulse is used for WLn storage elements for which the WLn−1 adjacent storage element is in the E or A state, in a first iteration, program pulses 1622 and 1624 are followed by one or more verify pulses 1626 for verifying the WLn storage elements of even numbered bit lines and one or more verify pulses 1628 for verifying the WLn storage elements of odd numbered bit lines. Subsequent iterations proceed accordingly. Pass voltages can be applied according to FIG. 14b, where Vread is applied for both sets of verify pulses.

Figure 17B:
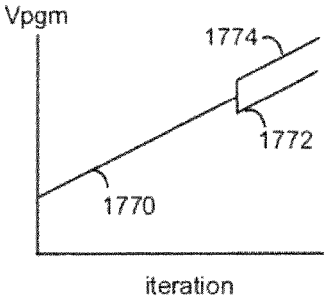
Figure 17A:
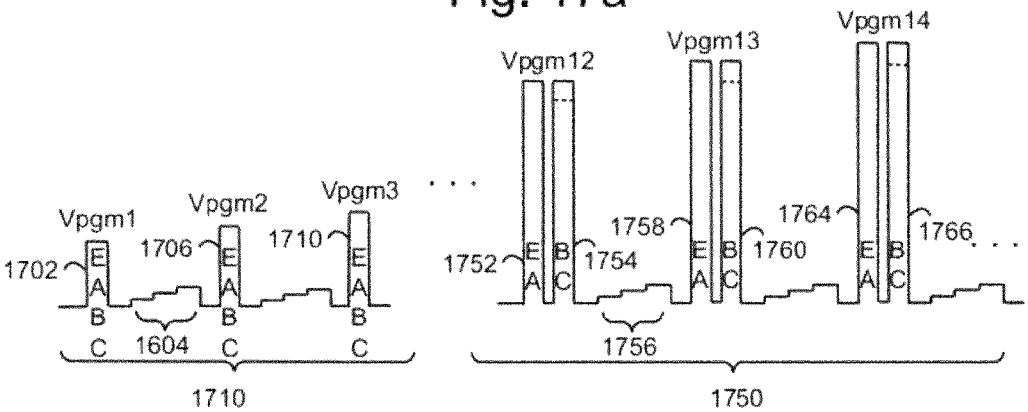
FIG. 17a depicts a pulse train applied to a selected word line during a program operation, in a fourth embodiment of a multi-pulse programming technique.

FIG. 17a depicts a pulse train applied to a selected word line during a program operation, in a fourth embodiment of a multi-pulse programming technique. As mentioned in connection with step 1506 of FIG. 15, a single-pulse programming phase 1710 may precede the multiple-pulse programming phase 1750 to shorten program time while preserving the benefits of using different pass voltages based on the WLn−1 storage element data state. In one possible implementation, the single-pulse program phase includes program pulses 1702, 1706 and 1710, which program WLn storage elements concurrently regardless of the data state of the WLn−1 storage elements. Example verify pulses 1604 are also depicted. In this example, a trigger condition is met after the eleventh program pulse, as an illustration, so that the program pulses 1752 and 1754 are used in the first iteration of the multiple-pulse programming phase 1750.

The WLn−1 storage elements may be read at the start of the single-pulse programming phase or at the start of the multiple-pulse programming phase, for instance. In the multiple-pulse programming phase, the program pulse 1752 programs WLn storage elements for which the adjacent WLn−1 storage element is in the E or A state, and the program pulse 1754 programs WLn storage elements for which the adjacent WLn−1 storage element is in the B or C state. A set of one or more verify pulses 1756 follow. Program pulses 1758 and 1760, and 1764 and 1766 are similarly applied to WLn in subsequent iterations until programming is complete.

In one possible approach, the multiple-pulse programming phase is triggered when a specific program iteration has been reached, e.g., the twelfth iteration. Or, in an adaptive approach, the multiple-pulse programming phase can be triggered when a specific number of storage elements on WLn have been verified to have completed programming for a target verify level. The target verify level can be used for a target data state, or can be between data states. For example, with states E, A, B and C, the trigger verify level may be the verify level for state B. e.g., Vvb. In this case, only one verify pulse, Vvc, need be used in the multiple-pulse programming phase, when the A and B storage elements have completed programming. As an example, the multiple-pulse programming phase can be triggered when 90% of B-state storage elements exceed Vvb. At this time, assume all A-state storage elements have completed programming. In the multiple-pulse programming phase, verify pulses for the B and C states are used initially. Once, the remaining 10% of the B-state storage elements complete programming, only C-state storage elements remain, so that only a verify pulse Vvc is used.

FIG. 17b depicts different program pulse amplitudes which correspond to FIG. 17a. The curve 1770 can be used to set Vpgm based on the program iteration in the single-pulse programming phase. Curve 1774 is used to set Vpgm based on the program iteration in the multiple-pulse programming phase, when VpassL is applied to WLn−1. Curve 1772 is used to set Vpgm based on the program iteration in the multiple-pulse programming phase, when VpassH is applied to WLn−1. Thus, there is a step up in Vpgm to compensate for coupling due to the lower pass voltage and a step down in Vpgm to compensate coupling due to the higher pass voltage, so that the effective program voltage is incremented at a steady rate.

Figure 17C:
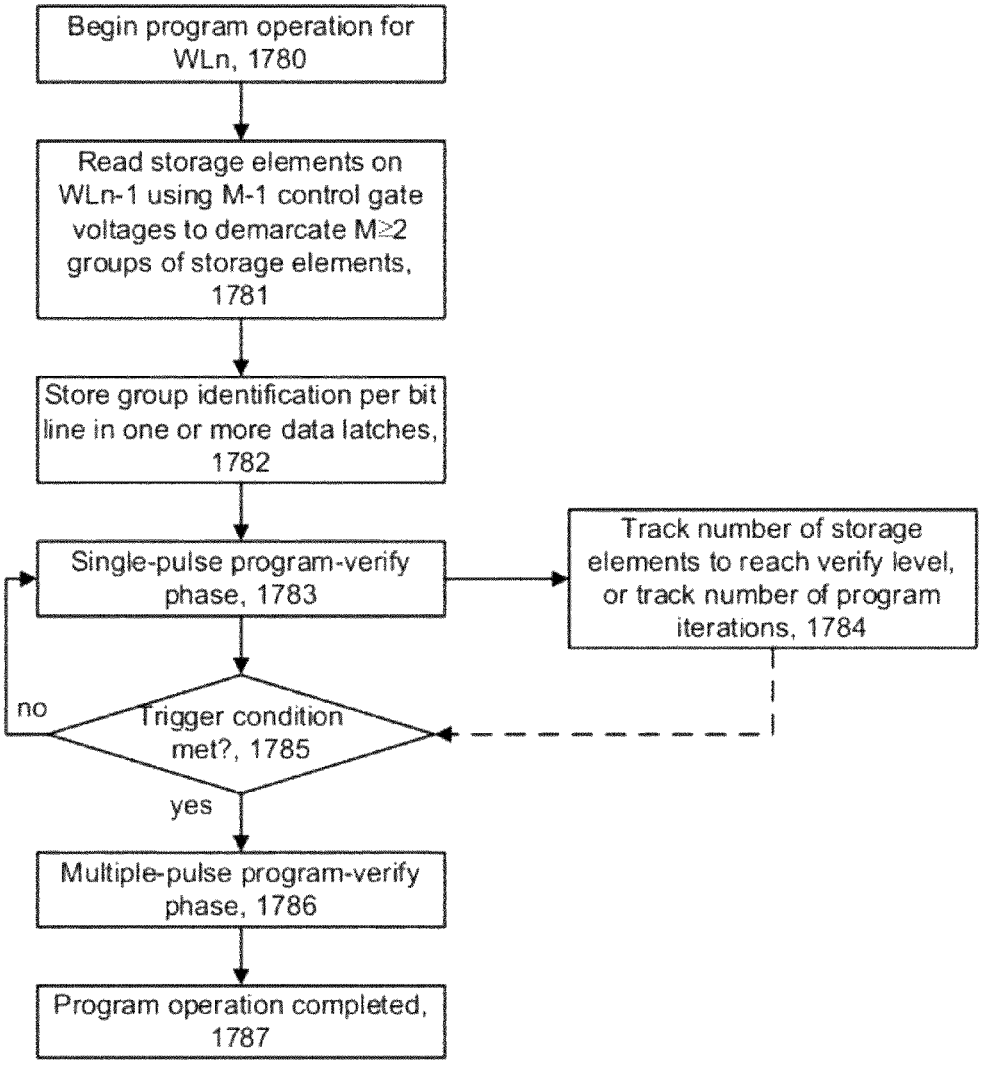

FIG. 17c depicts a programming technique corresponding to FIG. 17a. In this approach, WLn−1 is read at the start of the program operation. At step 1780, a program operation begins for WLn. At step 1781, the storage elements on WLn−1 are read using M−1 control gate voltages to demarcate groups of storage elements and associated bit lines or NAND strings. At step 1782, a group identification is stored for each bit line in one or more data latches. At step 1783, a single-pulse program-verify phase begins. During this phase, the number of storage elements to reach a verify level, or the number of program iterations is tracked, at step 1784, to determine if a trigger condition is met. At decision step 1785, if the trigger condition is met, the multiple-pulse program-verify phase is performed, at step 1786, and finally the program operation is completed, at step 1787. If the trigger condition is not met at decision step 1785, another other iteration of the single-pulse program-verify phase is performed.

Figure 17D:
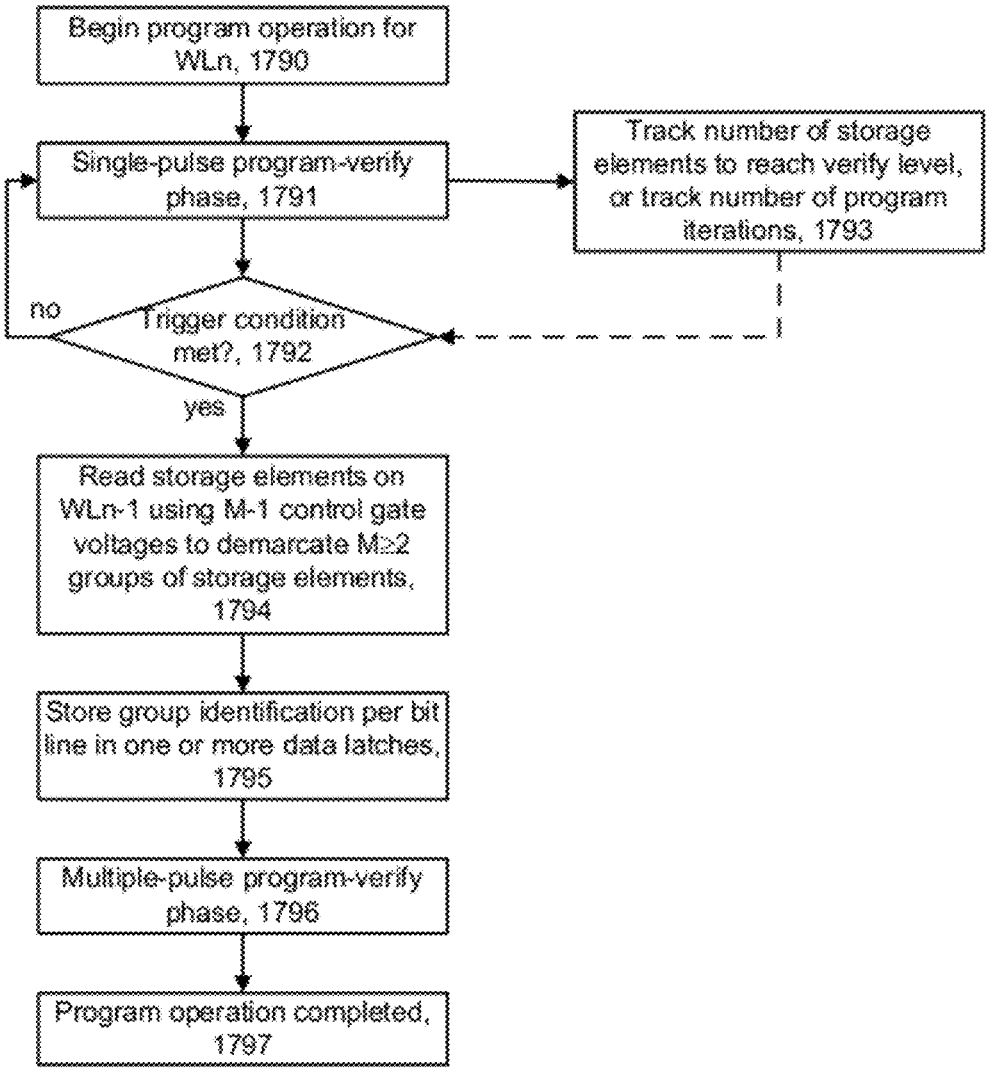

FIG. 17d depicts an alternative programming technique corresponding to FIG. 17a. In this approach, WLn−1 is read at the start of the multiple-pulse program-verify phase, after the single-pulse program-verify phase has completed and the trigger condition has been met. At step 1790, a program operation begins for WLn. At step 1791, the single-pulse program-verify phase is performed. During this phase, the number of storage elements to reach a verify level, or the number of program iterations is tracked, at step 1793, to determine if a trigger condition is met. At decision step 1792, if the trigger condition is met, the storage elements on WLn−1 are read using M−1 control gate voltages to demarcate M≥2 groups of storage elements and associated bit lines or NAND strings, at step 1794. If the trigger condition is not met at decision step 1792, another other iteration of the single-pulse program-verify phase is performed. At step 1795, a group identification is stored for each bit line in one or more data latches. The multiple-pulse program-verify phase is performed, at step 1796, and finally the program operation is completed, at step 1797.

Figure 18A:
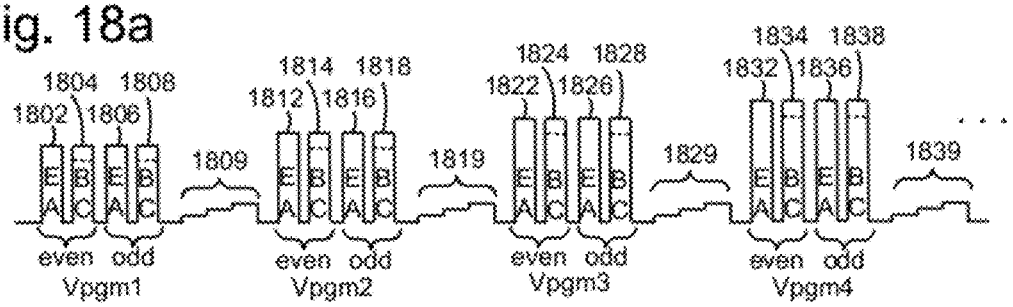
FIG. 18a depicts a pulse train applied to a selected word line during a program operation, in a fifth embodiment of a multi-pulse programming technique.

FIG. 18a depicts a pulse train applied to a selected word line during a program operation, in a fifth embodiment of a multi-pulse programming technique. In this approach, even numbered bit lines are programmed separately from odd numbered bit lines, but verified together. For example, in a four state embodiment, a first iteration includes program pulse 1802, which programs WLn storage elements of even numbered bit lines whose adjacent WLn−1 neighbor is in the E or A state, and a program pulse 1804 which programs WLn storage elements of even numbered bit lines whose adjacent WLn−1 neighbor is in the B or C state. Similarly, program pulse 1806 programs WLn storage elements of odd numbered bit lines whose adjacent WLn−1 neighbor is in the E or A state, and program pulse 1808 programs WLn storage elements of odd numbered bit lines whose adjacent WLn−1 neighbor is in the B or C state. One or more verify pulses 1809 follow.

Similarly, a second iteration includes program pulses 1812, 1814, 1816 and 1818 followed by one or more verify pulses 1819, a third iteration includes program pulses 1822, 1824, 1826 and 1828 followed by one or more verify pulses 1829, a fourth iteration includes program pulses 1832, 1834, 1836 and 1838 followed by one or more verify pulses 1839, and so forth.

Figure 18B:
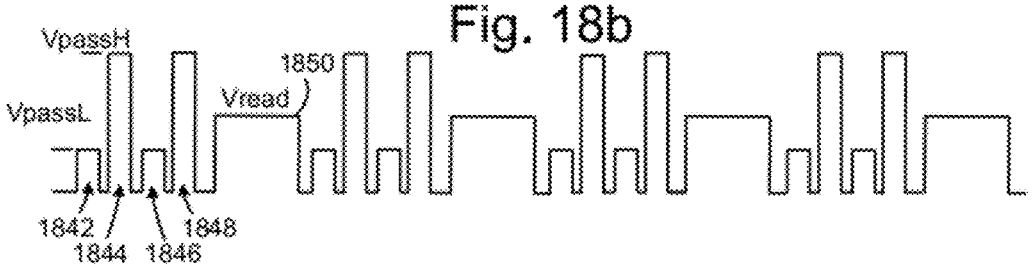

FIG. 18b depicts a pulse train applied to an adjacent unselected word line during the program operation of FIG. 18a. FIG. 18b is time aligned with FIG. 18a. VpassL voltages 1842 and 1846 are applied to WLn−1 when program pulses 1802 and 1806, respectively, are applied to WLn. VpassH voltages 1844 and 1848 are applied to WLn−1 when program pulses 1804 and 1808, respectively, are applied to WLn. Vread 1850 is applied to WLn−1 and other unselected word lines when verify pulses 1809 are applied to WLn. The set of pass voltages is repeated for each successive iteration.

Figure 18C:
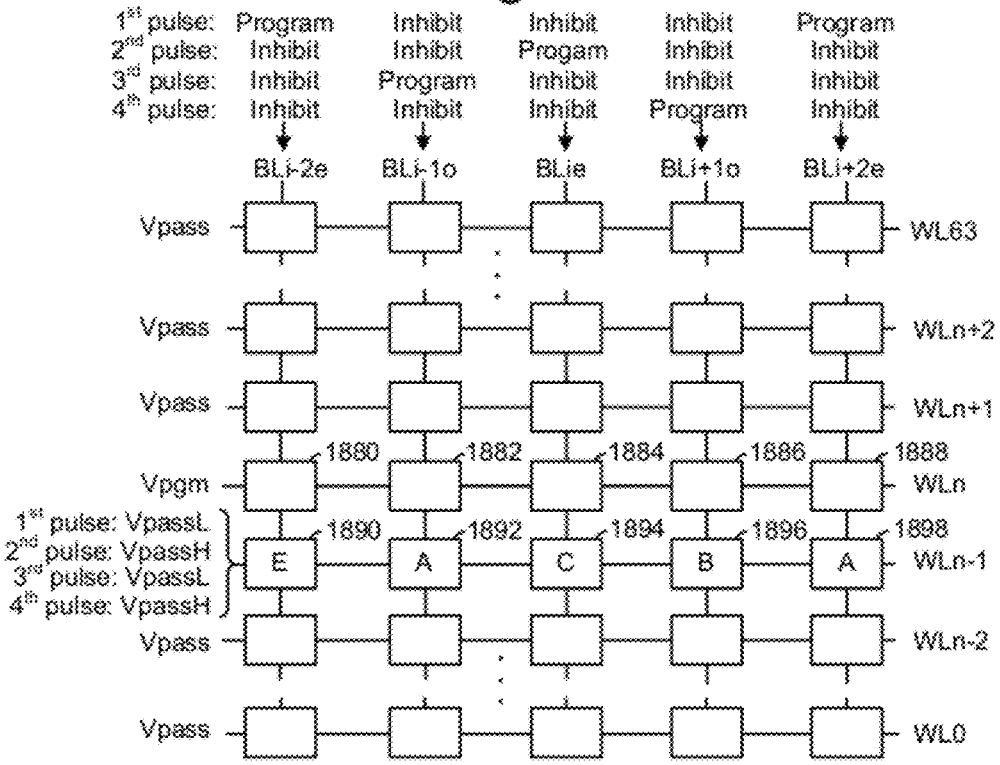
FIG. 18c depicts an example application of the fifth embodiment of a multi-pulse programming technique, as applied to a set of storage elements.

FIG. 18c depicts an example application of the fifth embodiment of a multi-pulse programming technique, as applied to a set of storage elements. Similar to FIG. 13c, WLn, the currently selected word line, is in communication with example storage elements 1880, 1882, 1884, 1886 and 1888, and WLn−1 is in communication with example storage elements 1890, 1892, 1894, 1896 and 1898. BLi−2e, BLie and BLi+2e are example even numbered bit lines, and BLi−1o and BLi+1o are example odd numbered bit lines.

During the first program pulse 1802, 1812, 1822 and 1832 (FIG. 18a) of each program iteration, the storage elements in WLn of even numbered bit lines which are adjacent to E- or A-state storage elements on WLn−1 are selected for programming, in an even bit line phase. Here, storage elements 1880 and 1888 are selected while VpassL is applied to WLn−1. During the second program pulse 1804, 1814, 1824 and 1834 of each program iteration, the storage elements in WLn of even numbered bit lines which are adjacent to B- or C-state storage elements on WLn−1 are selected for programming. Here, storage element 1884 is selected while VpassH is applied to WLn−1.

During the third program pulse 1806, 1816, 1826 and 1836 of each program iteration, the storage elements in WLn of odd numbered bit lines which are adjacent to E- or A-state storage elements on WLn−1 are selected for programming, in an odd bit line phase. Here, storage element 1882 is selected while VpassL is applied to WLn−1. During the fourth program pulse 1808, 1818, 1828 and 1838 of each program iteration, the storage elements in WLn of odd numbered bit lines which are adjacent to B- or C-state storage elements on WLn−1 are selected for programming. Here, storage element 1886 is selected while VpassH is applied to WLn−1.

Figure 19:
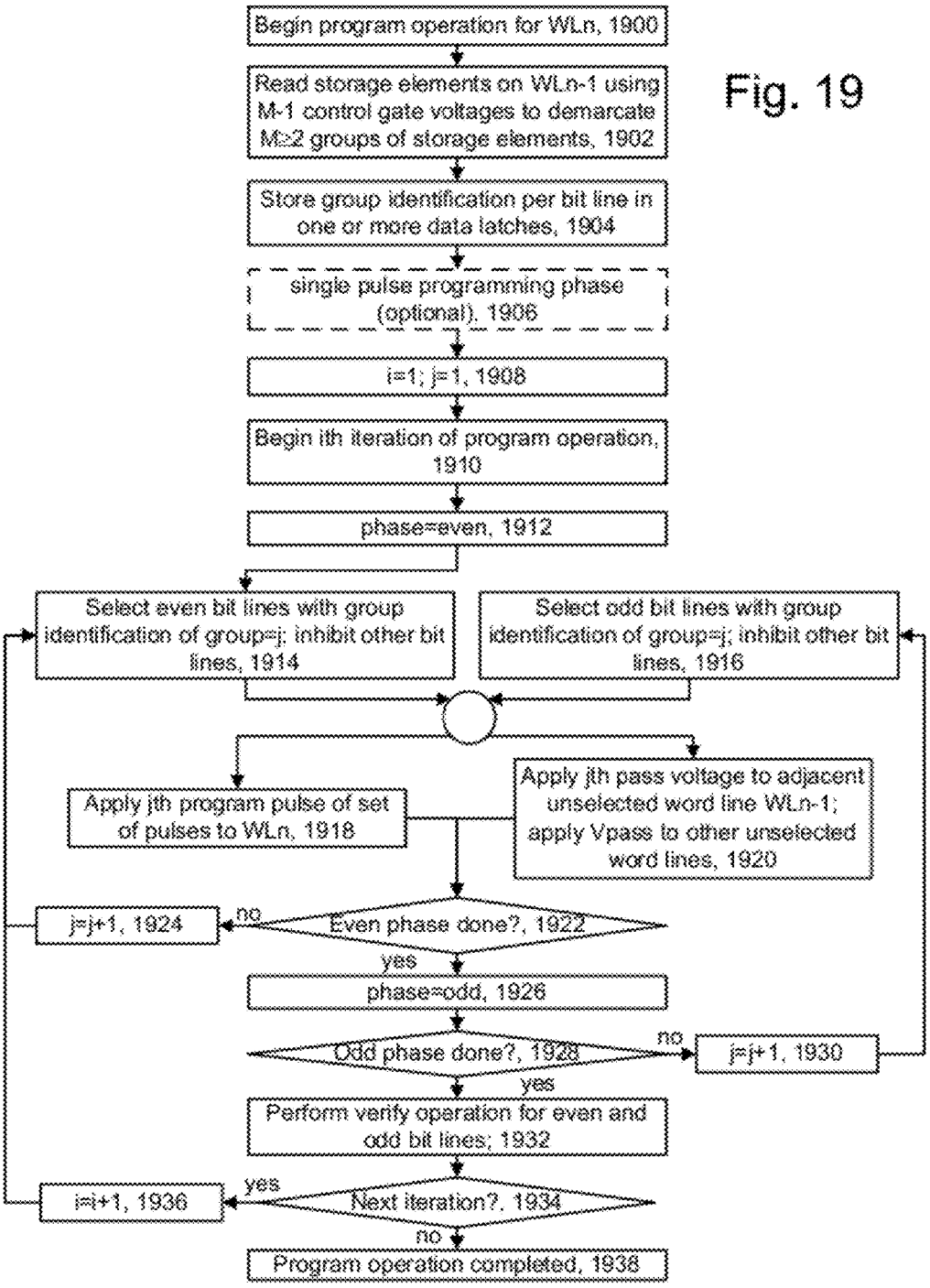

FIG. 19 depicts a programming technique corresponding to FIG. 18a. At step 1900, a program operation for WLn begins. At step 1902, the storage elements on WLn−1 are read using M−1 control gate voltages to demarcate only M≥2 groups of storage elements. At step 1904, group identification is stored for each bit line or NAND string in one or more data latches. At optional step 1906, a single-pulse programming phase is performed. At step 1908, a program iteration index i and a program pulse index j are set to one. At step 1910, the ith multiple program pulse iteration of the program operation begins. At step 1912, an even bit line program phase begins. Step 1914 includes selecting even numbered bit lines having a group identification of group=j and inhibiting other bit lines. For example, a first group of bit lines, group1, is selected when j=1.

At step 1918, the jth program pulse of a set of program pulses is applied to WLn, while at step 1920, a jth pass voltage is applied to the adjacent word line WLn−1, and Vpass is applied to the other unselected word lines. At decision step 1922, if the current (even bit line) program phase is not completed, then j is incremented at step 1924 and steps 1914, 1918 and 1920 are repeated. For example, a second group of bit lines, group2, is selected when j=2.

If the even bit line program phase is completed at decision step 1922, the odd bit line program phase begins at step 1926. If the odd phase is not yet completed at decision step 1928, step 1930 increments j, and step 1916 selects off numbered bit lines having a group identification of grouper while inhibiting other bit lines. For example, a third group of bit lines, group3, is selected when j=3. Steps 1918 and 1920 are repeated as discussed. Decision step 1922 is true, so that the odd phase continues at 1926. If the odd phase is completed, at decision step 1928, a verify operation is performed for the even and odd bit lines (either concurrently or separately) at step 1932.

At decision step 1934, if there is a next program iteration, is incremented at step 1936 and steps 1914, 1918 and 1920 are repeated. If there is no next program iteration at decision step 1934, the programming operation is completed, at step 1938.

Figure 20A:
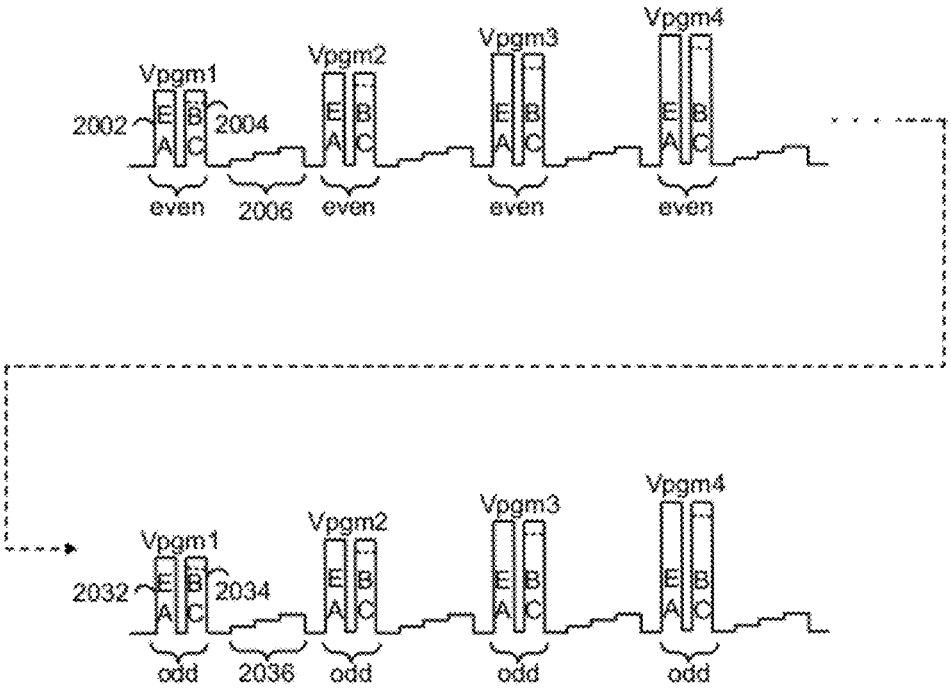
FIG. 20a depicts a pulse train applied to a selected word line during a program operation, in a sixth embodiment of a multi-pulse programming technique.

FIG. 20a depicts a pulse train applied to a selected word line during a program operation, in a sixth embodiment of a multi-pulse programming technique. In this approach, all even numbered bit lines are programmed completely, then all odd numbered bit lines are programmed completely, in separate program phases. This is useful for memory devices which do not have an all bit line sensing capability. A first iteration of a first program phase includes a program pulse 2002 which programs storage elements on WLn for even numbered bit lines for which the adjacent WLn−1 storage element is in state E or A, for instance. A program pulse 2004 programs storage elements on WLn for even numbered bit lines for which the adjacent WLn−1 storage element is in state B or C, for instance. Verify pulses 2006 for the even numbered bit lines follow. Subsequent iterations of the first program phase are similarly performed until the storage elements in communication with the even numbered bit lines have completed programming.

Subsequently, a second program phase is performed for odd numbered bit lines. A first iteration of the second program phase includes a program pulse 2032 which programs storage elements on WLn for odd numbered bit lines for which the adjacent WLn−1 storage element is in state E or A, for instance. A program pulse 2034 programs storage elements on WLn for odd numbered bit lines for which the adjacent WLn−1 storage element is in state B or C, for instance. Verify pulses 2036 for the odd numbered bit lines follow. Subsequent iterations of the second program phase are similarly performed until the storage elements in communication with the odd numbered bit lines have completed programming.

Figure 20B:
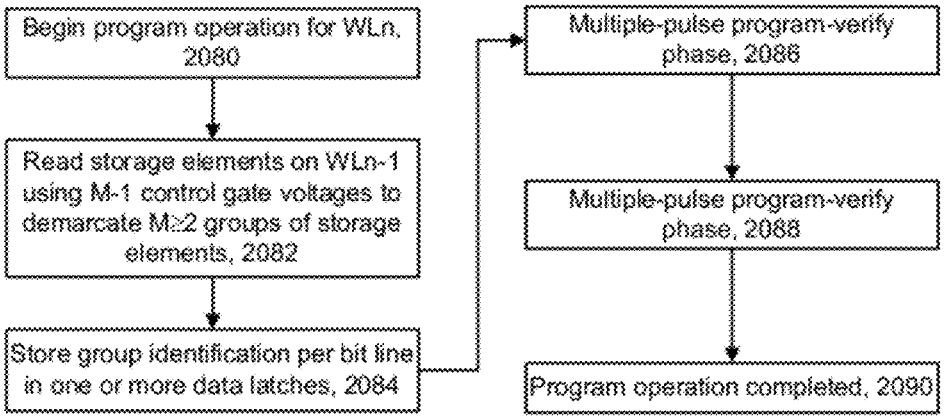

FIG. 20b depicts a programming technique corresponding to FIG. 20a. In one approach, the read operation for WLn−1 is performed before the program operation. Specifically, at step 2080, a program operation for WLn begins. At step 2082, the storage elements on WLn−1 are read using M−1 control gate voltages to demarcate only groups of storage elements. At step 2084, a group identification is stored for each bit line or NAND string in one or more data latches. At step 2086, a multiple-pulse program-verify phase for the storage elements of the even numbered bit lines is performed. At step 2088, a multiple-pulse program-verify phase for the storage elements of the odd numbered bit lines is performed. The program operation is completed at step 2090.

In another possible approach, a read operation is performed for even numbered bit lines just prior to the associated programming phase, and a separate read operation is performed for odd numbered bit lines just prior to the associated programming phase.

Figure 21A:
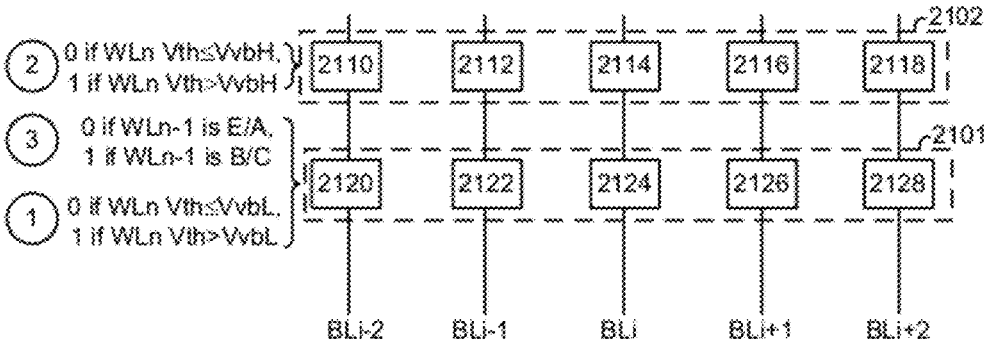
FIG. 21a depicts the use of data latches for respective bit lines during a seventh embodiment of multi-pulse programming technique.

FIG. 21a depicts the use of data latches for respective bit lines during a seventh embodiment of multi-pulse programming technique. As mentioned previously in connection with FIG. 15, in a memory device, a number of data latches, each storing one bit, may be provided for each bit line. With one bit per latch, K latches per bit line are used to store K bits of data to identify $2^K$=M different groups of bit lines and associated storage elements. Moreover, as mentioned previously in connection with FIG. 8, a dual verify programming technique may be used in which low and high verify levels are used for one or more data states. As mentioned, the dual verify levels can be used for fewer than all programmed states. As an example, with programmed states A, B and C, dual verify levels can be used for only states A and B, but not state C. For example, VvaL and VvaH are lower and higher verify levels, respectively, for the A state, and VvbL and VvbH are lower and higher verify levels, respectively, for the B state. Such a dual verify programming technique can be efficiently integrated with the various above-described embodiments of a multiple-pulse programming technique. This approach avoids or minimizes the need for additional latch hardware.

Each bit line has two latches, each storing one bit, in this example. A first set of latches 2101 includes latches 2120, 2122, 2124, 2126 and 2121 which are connected to bit lines BLi−2, BLi−1, BL, BLi+1 and BLi+2, respectively. A second set of latches 2102 includes latches 2110, 2112, 2114, 2116 and 2118 which are connected to bit lines BLi−2, BLi−1, BL, BLi+1 and BLi+2, respectively. Initially, all 0 bits are stored in the latches. During programming, as represented by the circled "1," when the threshold voltage Vth of a storage element which is intended to be programmed to a target state of B, for instance, exceeds the lower verify level, VvbL (e.g., Vth>VvbL), the corresponding latch in set 2101 is set to bit=1. Bit=0 remains in the latches of set 2101 as long as Vth≤VvbL.

Subsequently, as represented by the circled "2," when the threshold voltage Vth of a storage element which is intended to be programmed to the target state of B, for instance, exceeds the higher verify level, VvbH (e.g., Vth>VvbH), the corresponding latch in set 2102 is set to bit=1. Bit =0 remains in the latches of set 2102 as long as Vth≤VvbH. When Vth>VvbH for all B state storage elements, the data in the set of latches 2101 is no longer needed and the multi-pulse program-verify phase can begin. That is, the bits which indicate whether the lower verify level has been reached are irrelevant once the higher verify level has been reached for all the storage elements which are to be programmed to the state which is associated with the higher verify level.

Note that the reference to "all" the storage elements which are to be programmed to a target state is meant to include all storage elements which are not ignored. For example, a page of data can be 8 KB stored in 64 K storage elements. A small portion of the storage elements will be defective, having a physical defect, or some other issue which can make them very slow to program, requiring extra program pulses. For example, evaluations may determine that 32 out of 64 K storage elements, on average, may be defective. So, during programming, without specifically knowing which bits are good or bad, we may choose to ignore 32 bits and do not force them to program. It is more efficient to ignore a few storage elements and use the ECC to correct them. The number of storage elements to be ignored can be determined by parameters on a ROM fuse.

Figure 21B:
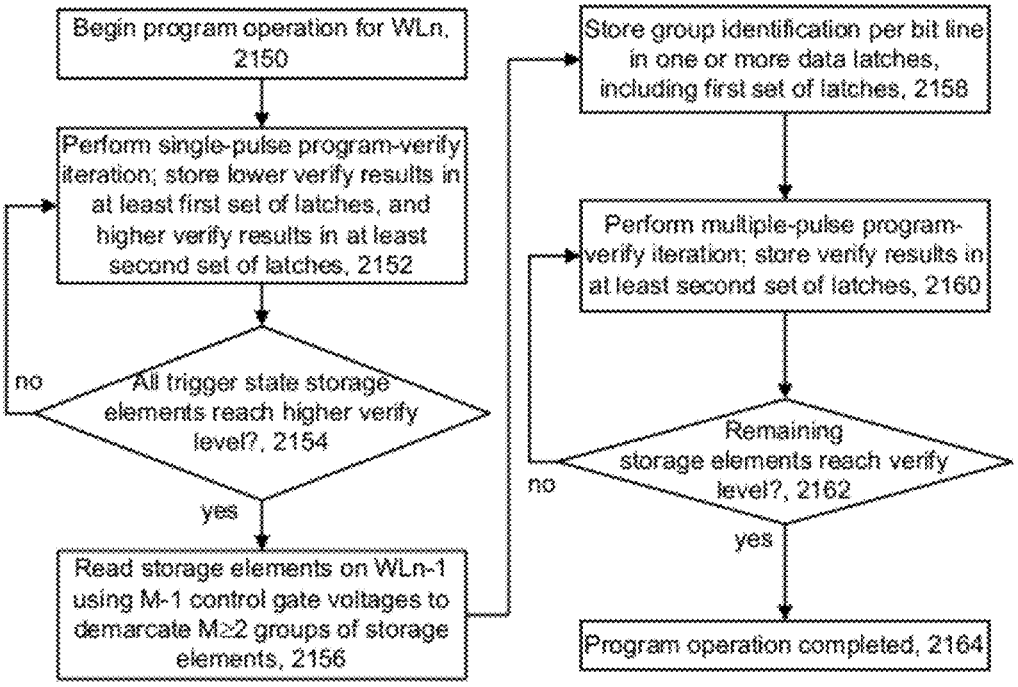

In a phase represented by the circled "3," the data in the set of latches 2101 can be overwritten to identify a group of bit lines for the WLn−1 storage elements (see also FIG. 21b). For example, bit =0 can be set for a WLn−1 storage element in state E or A, and bit=1 can be set for a WLn−1 storage element in state B or C. This reuse of latches avoids the need for another set of latches.

When the set of latches 2101 is reused, all prior data stored in those latches is lost. This is why the set of latches should not be overwritten until all storage elements which are subject to dual verify levels have reached the associated high verify level. For example, once all B state storage elements have reached VvbH, and the latches 2101 are overwritten in phase "3", the information regarding whether a storage element has reached VvbL is lost. So, we must ensure that all B state storage elements have reached VvbH (at which time it is inherent that the storage elements have also reached VvbL) and have been locked out from further programming before phase "3."

The latches are read by control circuitry to determine when programming has been completed for the B state storage elements. For storage elements which do not use dual verify levels, such as, e.g., C state storage elements, no lower verify level is used, so the corresponding latch in the set 2101 is not used. Instead, the associated latch in the set 2102 is set to bit=1 when the Vth exceeds the verify level Vvc (e.g., Vth>Vvc). Otherwise, if Vth≤Vvc, bit=0.

Other implementations are possible. For example, for an eight state memory device, dual verify levels may be used for the A-F states, where G is the highest state. Additional sets of latches may be used to identify the groups of bit lines for the WLn−1 storage elements.

FIG. 21b depicts a programming technique corresponding to FIG. 21a. At step 2150, a program operation begins for WLn. At step 2152, a single-pulse program-verify iteration is performed in which lower and higher verify levels are used for at least one data state. The highest data state for which lower and higher verify levels are used, e.g., the B state in the example of FIG. 8, may also be a trigger state which initiates the multiple-pulse program-verify phase of the program operation. The lower verify results are stored in at least the first set of latches 2101, and the higher verify results are stored in at least the second set of latches 2102. At decision step 2154, if the trigger state storage elements have not yet reached the higher verify level, step 2152 is repeated in a next single-pulse program-verify iteration. If decision step 2154 is true, step 2156 is performed. At step 2156, the storage elements on WLn−1 are read using M−1 control gate voltages to demarcate only M groups of storage elements. At step 2158, a group identification is stored for each bit line or NAND string in one or more data latches, including the first set of latches 2101.

At step 2160, a multiple-pulse program-verify iteration is performed in which a verify level is used for at least one remaining data state. The remaining data state may be the highest data state, e.g., the C state. The verify results are stored in at least the second set of latches 2102. When there are only two groups of bit lines, one bit is sufficient to identify each group (e.g., bit=0 for group1 and bit=1 for group 2). When there are more than two groups of bit lines, two or more latches are needed. For example, with four groups of bit lines, two bits are needed, so one additional set of latches beyond the sets 2101 and 2102 are needed. The set 2102 is used for storing verify data for the remaining storage elements to complete programming, and is therefore not available to store bit line group data.

At decision step 2162, if the remaining storage elements have not yet reached their verify levels, step 2160 is repeated so that an additional multiple-pulse program-verify iteration is performed. If step 2162 is true, the program operation is completed, at step 2164. The remaining storage elements do not include the number of bits which are to be ignored.

In one embodiment of the technology described herein, a method for operating a non-volatile storage system which includes a set of non-volatile storage elements in communication with a set of word lines and a set of bit lines is provided. The method includes performing at least one sense operation involving an adjacent word line of a selected word line of the set of word lines, where the at least one sense operation demarcates M≥2 groups of non-volatile storage elements on the adjacent word line, and the M≥2 groups of non-volatile storage elements are associated with M≥2 corresponding groups of bit lines of the set of bit lines, including at least first and second groups of bit lines. The method further includes performing multiple iterations of a programming sequence, including at least one iteration which includes: (a) applying a first programming pulse to the selected word line while selecting for programming, non-volatile storage elements of the selected word line which are associated with the first group of bit lines, inhibiting programming of non-volatile storage elements of the selected word line which are associated with the second group of bit lines, and applying a first pass voltage to the adjacent word line, and (b) applying a second programming pulse to the selected word line while selecting for programming, the non-volatile storage elements of the selected word line which are associated with the second group of bit lines, inhibiting programming of the non-volatile storage elements of the selected word line which are associated with the first group of bit lines, and applying a second pass voltage to the adjacent word line.

In another embodiment, a non-volatile storage system includes a set of non-volatile storage elements, a set of word lines in communication with the set of non-volatile storage elements, including a selected word line and an adjacent word line of the selected word line, a set of bit lines in communication with the set of non-volatile storage element, and at least one control circuit in communication with the set of word lines and the set of bit lines. The at least one control circuit performs at least one sense operation involving the adjacent word line, the at least one sense operation demarcates M≥2 groups of non-volatile storage elements on the adjacent word line, where the M≥2 groups of non-volatile storage elements are associated with M≥2 corresponding groups of bit lines of the set of bit lines, including at least first and second groups of bit lines. The at least one control circuit also performs multiple iterations of a programming sequence, including at least one iteration in which the at least one control circuit (i) applies a first programming pulse to the selected word line and selects for programming, non-volatile storage elements of the selected word line which are associated with the first group of bit lines, inhibits programming of non-volatile storage elements of the selected word line which are associated with the second group of bit lines, and applies a first pass voltage to the adjacent word line, and (ii) applies a second programming pulse to the selected word line and selects for programming, the non-volatile storage elements of the selected word line which are associated with the second group of bit lines, inhibits programming of the non-volatile storage elements of the selected word line which are associated with the first group of bit lines, and applies a second pass voltage to the adjacent word line.

In another embodiment, a method is provided for operating a non-volatile storage system which includes strings of series-connected non-volatile storage elements in communication with a set of word lines. The method includes applying a sense voltage to an adjacent word line of a selected word line of the set of word lines, identifying at least a first group of non-volatile storage elements on the adjacent word line whose threshold voltages fall below the sense voltage, and a second group of non-volatile storage elements on the adjacent word line whose threshold voltages exceed the sense voltage, and storing data identifying each string which has one of the non-volatile storage elements in the first group, and each string which has one of the non-volatile storage elements in the second group, thereby providing stored data. The method further includes, in one time period, while applying a first pass voltage to the adjacent word line, and based on the stored data: programming non-volatile storage elements of the selected word line which are in the strings which have the non-volatile storage elements of the adjacent word line in the first group, and inhibiting programming of non-volatile storage elements of the selected word line which are in the strings which have the non-volatile storage elements of the adjacent word line in the second group. The method further include, in another time period, while applying a second pass voltage to the adjacent word line, and based on the stored data: programming the non-volatile storage elements of the selected word line which are in the strings which have the non-volatile storage elements of the adjacent word line in the second group, and inhibiting programming of the non-volatile storage elements of the selected word line which are in the strings which have the non-volatile storage elements of the adjacent word line in the first group.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating a non-volatile storage system which includes a set of non-volatile storage elements in communication with a set of word lines and a set of bit lines, the method comprising:

performing at least one sense operation involving an adjacent word line of a selected word line of the set of word lines, the at least one sense operation demarcates M≥2 groups of non-volatile storage elements on the adjacent word line, the groups of non-volatile storage elements are associated with M≥2 corresponding groups of bit lines of the set of bit lines, including at least first and second groups of bit lines; and performing multiple iterations of a programming sequence, including at least one iteration which includes:

applying a first programming pulse to the selected word line while selecting for programming, non-volatile storage elements of the selected word line which are associated with the first group of bit lines, inhibiting programming of non-volatile storage elements of the selected word line which are associated with the second group of bit lines, and applying a first pass voltage to the adjacent word line; and applying a second programming pulse to the selected word line while selecting for programming, the non-volatile storage elements of the selected word line which are associated with the second group of bit lines, inhibiting programming of the non-volatile storage elements of the selected word line which are associated with the first group of bit lines, and applying a second pass voltage to the adjacent word line.

2. The method of claim 1, wherein no verify operation is performed for non-volatile storage elements of the selected word line between the first and second programming pulses of the at least one iteration, the method further comprising:

after the second programming pulse, performing a verifying operation for non-volatile storage elements of the selected word line, after which another iteration of the programming sequence is performed.

3. The method of claim 1, wherein:

the non-volatile storage elements on the adjacent word line store data in at least M+1 data states; and the at least one sense operation demarcates only M≥2 groups of non-volatile storage elements on the adjacent word line.

4. The method of claim 1, wherein:

the at least one sense operation demarcates the M≥2 groups of non-volatile storage elements on the adjacent word line according to threshold voltages of the non-volatile storage elements on the adjacent word line;

non-volatile storage elements of the adjacent word line which are associated with the first group of bit lines have lower threshold voltages than non-volatile storage elements of the adjacent word line which are associated with the second group of bit lines; and the first pass voltage is lower than the second pass voltage.

5. The method of claim 1, wherein:

the at least one sense operation demarcate the M≥2 groups of non-volatile storage elements on the adjacent word line according to threshold voltages of the non-volatile storage elements on the adjacent word line;

non-volatile storage elements of the adjacent word line which are associated with the first group of bit lines have higher threshold voltages than non-volatile storage elements of the adjacent word line which are associated with the second group of bit lines; *and* the first pass voltage is higher than the second pass voltage.

6. The method of claim 1, wherein:

at least one prior iteration of the multiple iterations of the programming sequence which occurs before the at least one iteration includes applying a programming pulse to the selected word line while concurrently selecting for programming, non-volatile storage elements of the selected word line which are associated with both the first and second groups of bit lines.

7. The method of claim 6, wherein:

the at least one prior iteration includes applying a pass voltage to the adjacent word line whose amplitude is between amplitudes of the first and second pass voltages.

8. The method of claim 1, wherein:

the adjacent word line is on a source side of the selected word line.

9. The method of claim 1, wherein:

prior iterations of the multiple iterations of the programming sequence, which occur before the at least one iteration, program at least one non-volatile storage element of the selected word line to one target data state; and the at least one iteration programs at least one other non-volatile storage element of the selected word line to another target data state which is higher than the one target data state.

10. The method of claim 9, wherein:

at least first and second latches are associated with one of the bit lines of the set of bit lines;

the at least one non-volatile storage element is programmed during the prior iterations using a first verify level, and then a second verify level which is higher than the first verify level;

the first latch stores a bit which indicates whether the at least one non-volatile storage element has been programmed to the first verify level;

the second latch stores a bit which indicates whether the at least one non-volatile storage element has been programmed to the second verify level;

the at least one sense operation is performed partway through the programming sequence, after the prior iterations; and during the at least one sense operation, a non-volatile storage element of the adjacent word line, and associated with the one of the bit lines, is sensed, and the first latch is overwritten to store a bit to identify, at least in part, a group of the groups of non-volatile storage elements to which the non-volatile storage element of the adjacent word line belongs.

11. The method of claim 10, wherein:

the at least one sense operation is performed partway through the programming sequence, after the prior iterations, in response to determining that the at least one non-volatile storage element of the selected word line has been programmed to the one target data state.

*12. The method of claim 1, wherein:*

*the set of non-volatile storage elements is arranged in a three-dimensional memory structure.*

*13. The method of claim 1, wherein:*

*the non-volatile storage elements in the set of non-volatile storage elements comprise a non-volatile, charge storing non-conductive dielectric material.*

* * * * *